United States Patent
Takeya et al.

(10) Patent No.: US 10,096,647 B2
(45) Date of Patent: Oct. 9, 2018

(54) DISPLAY APPARATUS HAVING A PLURALITY OF REFLECTIVE ELECTRODES

(71) Applicant: Seoul Semiconductor Co., Ltd., Ansan-si (KR)

(72) Inventors: Motonobu Takeya, Ansan-si (KR); Young Hyun Kim, Ansan-si (KR); Jong Ik Lee, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 15/621,004

(22) Filed: Jun. 13, 2017

(65) Prior Publication Data

US 2017/0358624 A1    Dec. 14, 2017

Related U.S. Application Data

(60) Provisional application No. 62/349,343, filed on Jun. 13, 2016, provisional application No. 62/371,510, filed on Aug. 5, 2016.

(51) Int. Cl.
| | |
|---|---|
| *H01L 27/15* | (2006.01) |
| *H01L 33/40* | (2010.01) |
| *H01L 33/42* | (2010.01) |
| *H01L 33/50* | (2010.01) |
| *H01L 33/52* | (2010.01) |

(52) U.S. Cl.
CPC .......... *H01L 27/156* (2013.01); *H01L 33/405* (2013.01); *H01L 33/42* (2013.01); *H01L 33/507* (2013.01); *H01L 33/52* (2013.01)

(58) Field of Classification Search
CPC ..... H01L 27/156; H01L 33/405; H01L 33/42; H01L 33/507; H01L 33/52
See application file for complete search history.

(56) References Cited

U.S. PATENT DOCUMENTS

| 7,597,602 B2* | 10/2009 | Yamada | H01L 51/5228 313/506 |
|---|---|---|---|
| 7,630,027 B2* | 12/2009 | Koma | G02F 1/1336 349/110 |
| 8,917,015 B2* | 12/2014 | Iwata | H05B 33/22 313/504 |

(Continued)

OTHER PUBLICATIONS

International Search Report dated Sep. 20, 2017 for PCT Application No. PCT/KR2017/006038.

*Primary Examiner* — Ida M Soward
(74) *Attorney, Agent, or Firm* — H.C. Park & Associates, PLC

(57) ABSTRACT

A display apparatus including a light emitting diode part including a plurality of regularly arranged light emitting diodes, and a TFT panel part configured to drive the light emitting diode part. The light emitting diode part includes a transparent electrode, the light emitting diodes regularly disposed on a first surface of the transparent electrode and electrically connected to the transparent electrode, a plurality of first reflective electrodes disposed at sides of the light emitting diodes, surrounding the light emitting diodes, and electrically connected to the transparent electrode, and a plurality of second reflective electrodes electrically connected to the light emitting diodes, respectively, and reflecting light emitted from the light emitting diodes.

24 Claims, 14 Drawing Sheets

(56) References Cited

U.S. PATENT DOCUMENTS

| | | | |
|---|---|---|---|
| 9,159,700 B2 | 10/2015 | Sakariya et al. | |
| 9,236,400 B2 | 1/2016 | Yamazaki et al. | |
| 2005/0259049 A1* | 11/2005 | Chen | H01L 27/322 345/76 |
| 2006/0197892 A1* | 9/2006 | Fujiwara | G02F 1/133553 349/113 |
| 2011/0006316 A1 | 1/2011 | Ing et al. | |
| 2011/0210332 A1* | 9/2011 | Jintyou | G02F 1/133524 257/59 |
| 2013/0194519 A1 | 8/2013 | Ivanov | |
| 2014/0357004 A1* | 12/2014 | Sagawa | H01L 27/3211 438/34 |
| 2015/0147831 A1 | 5/2015 | Lee et al. | |
| 2016/0372528 A1* | 12/2016 | Kamura | H01L 51/0096 |
| 2017/0338439 A1* | 11/2017 | Yokoyama | H01L 51/56 |

* cited by examiner

DISPLAY APPARATUS HAVING A PLURALITY OF REFLECTIVE ELECTRODES

CROSS-REFERENCE TO RELATED APPLICATION

This application claims priority from and the benefit of Provisional Application No. 62/349,343, filed on Jun. 13, 2016 and Provisional Application No. 62/371,510, filed on Aug. 5, 2016, which are incorporated by reference for all purposes as if fully set forth herein.

BACKGROUND

Field

Exemplary embodiments relate to a display apparatus and a method of manufacturing the same, and more particularly, to a display apparatus using micro-light emitting diodes and a method of manufacturing the same.

Discussion of the Background

A light emitting diode generally refers to an inorganic semiconductor device that emits light through recombination of electrons and holes, and has been used in various fields including displays, automobile lamps, general lighting, and the like. A light emitting diode has various advantages, such as long lifespan, low power consumption, and rapid response. As a result, a light emitting device using a light emitting diode is used as a light source in various fields.

Recently, many smart TVs and monitors realize colors using a thin film transistor liquid crystal display (TFT LCD) panel, and use light emitting diodes as a light source for a backlight unit for color realization. In addition, a display apparatus is often manufactured using organic light emitting diodes (OLEDs).

In a TFT-LCD, since one LED is used as a light source for many pixels, a backlight light source is kept in a turned-on state. As a result, the TFT-LCD suffers from constant power consumption regardless of brightness of a displayed screen.

In addition, although power consumption of OLED display apparatuses has been continuously reduced through continuous technological advancement, current version of the OLEDs still have much higher power consumption than LEDs formed of inorganic semiconductors, and thus, the modern OLEDs typically still have lower efficiency than LEDs.

Moreover, a passive matrix (PM) drive type OLED display apparatus may suffer from deterioration in response to speed of pulse amplitude modulation (PAM) of the OLED having large capacitances, and may also suffer from deterioration in lifespan as a result of high current driving through pulse width modulation (PWM), which realizes a low duty ratio.

Moreover, an active matrix (AM) driving type OLED display apparatus requires connection of TFTs for each pixel, thereby increasing manufacturing costs and resulting in increased brightness non-uniformity according to varying characteristics of the many TFTs.

SUMMARY

Exemplary embodiments provide a display apparatus using micro-light emitting diodes having low power consumption that may be applicable to a wearable apparatus, a smartphone, or a TV, and a method of manufacturing the same.

According to an exemplary embodiment, a display apparatus includes a light emitting diode part including a plurality of regularly arranged light emitting diodes, and a TFT panel part configured to drive the light emitting diode part. The light emitting diode part includes a transparent electrode, the light emitting diodes regularly disposed on a first surface of the transparent electrode and electrically connected to the transparent electrode, a plurality of first reflective electrodes disposed at sides of the light emitting diodes, surrounding the light emitting diodes, and electrically connected to the transparent electrode, and a plurality of second reflective electrodes electrically connected to the light emitting diodes, respectively, and reflecting light emitted from the light emitting diodes.

According to an exemplary embodiment, a display apparatus includes a light emitting part including a plurality of regularly arranged light emitting diodes, and a TFT panel part including a plurality of TFTs configured to drive the light emitting diodes. The light emitting part includes a substrate, the light emitting diodes, an encapsulation layer surrounding the light emitting diodes and including grooves exposing upper surfaces of the light emitting diodes, and a transparent electrode disposed on the light emitting diodes and electrically connected to the light emitting diodes through the grooves, and a plurality of reflective electrodes disposed on the substrate and surrounding the light emitting diodes so as to be separated from side surface of the light emitting diodes.

According to exemplary embodiments, the display apparatus employs micro-light emitting diodes formed of nitride semiconductors to realize high resolution, low power consumption, and high efficiency so as to be applicable to a variety of apparatus including a wearable apparatus.

In addition, the display apparatus according to the exemplary embodiments is configured to allow light emitted from side surfaces of the light emitting diodes to be discharged through reflection by reflective electrodes, thereby enabling reduction in thickness of the light emitting diode part.

In addition, the display apparatus according to the exemplary embodiments is configured to allow light emitted through upper and side surfaces of the light emitting diodes to be discharged outside and to allow light emitted through the side surfaces thereof to be discharged upwards through reflection by a reflective electrode, thereby improving luminous efficacy.

Furthermore, the display apparatus employs light emitted through the side surfaces of the light emitting diodes, thereby enabling reduction in thickness thereof.

BRIEF DESCRIPTION OF DRAWINGS

The accompanying drawings, which are included to provide a further understanding of the disclosed technology, and are incorporated in and constitute a part of this specification, illustrate exemplary embodiments of the disclosed technology, and together with the description serve to describe the principles of the disclosed technology.

DETAILED DESCRIPTION OF THE ILLUSTRATED EMBODIMENTS

Figure 1:
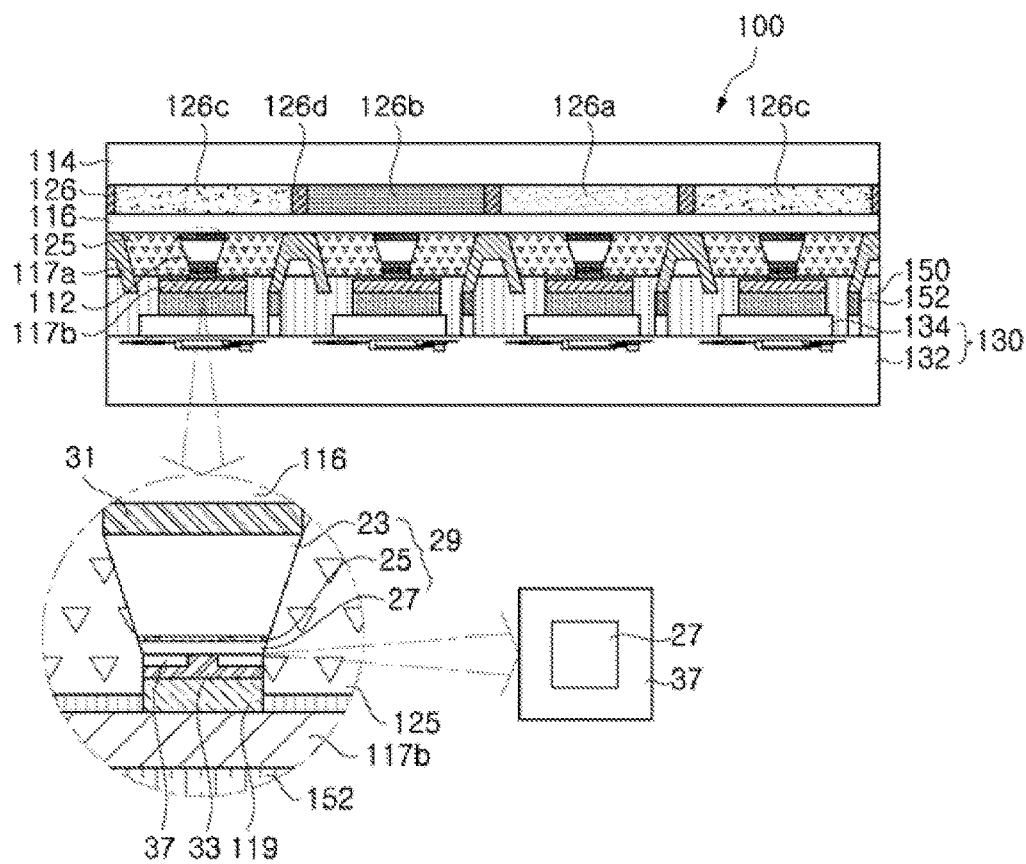
FIG. 1 is a cross-sectional view of a display apparatus according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a cross-sectional view of a display apparatus according to an exemplary embodiment.

Referring to FIG. 1, the display apparatus 100 according to the present exemplary embodiment includes a light emitting diode part 110, a TFT panel part 130, and an anisotropic conductive film 150.

The light emitting diode part 110 includes light emitting diodes 112, a support substrate 114, a phosphor layer 126, a transparent electrode 116, first reflective electrodes 117a, second reflective electrodes 117b, first connection electrodes 119, and an encapsulation layer 125.

The light emitting diode part 110 includes a plurality of light emitting diodes 112, which are regularly arranged on the support substrate 114. For example, the plurality of light emitting diodes 112 may be arranged at constant intervals in rows and columns. According to the present exemplary embodiment, the plurality of light emitting diodes 112 may include light emitting diodes emitting blue light or ultraviolet (UV) light.

In the display apparatus 100, the light emitting diode part 110 may be driven by power applied from an exterior power source. That is, each of the light emitting diodes 112 may be turned-on or turned-off in combination, and light emitted from the light emitting diodes 112 may be converted into red light, green light, and blue light while passing through the phosphor layer 126. Accordingly, the light emitting diode part 110 of the display apparatus 100 may be driven without a separate LCD.

A region including a single light emitting diode 112 may be used as a subpixel in the display apparatus 100. One pixel may include three or four subpixels. In the light emitting diode part 110, one subpixel may have a larger size than the light emitting diode 112 disposed in the subpixel.

Referring to FIG. 1, each of the light emitting diodes 112 includes an n-type semiconductor layer 23, an active layer 25, a p-type semiconductor layer 27, an n-type electrode 31, a p-type electrode 33, and an insulating layer 37. Here, a light emitting structure 29 including the n-type semiconductor layer 23, the active layer 25, and the p-type semiconductor layer 27 may include Group III-V based compound semiconductors. For example, the n-type semiconductor layer 23, the active layer 25, and the p-type semiconductor layer 27 may include nitride semiconductors such as (Al, Ga, In)N. According to exemplary embodiments, locations of the n-type semiconductor layer 23 and the p-type semiconductor layer 27 may be interchanged.

The n-type semiconductor layer 23 may include an n-type dopant (for example, Si) and the p-type semiconductor layer 27 may include a p-type dopant (for example, Mg). The active layer 25 is interposed between the n-type semiconductor layer 23 and the p-type semiconductor layer 27. The active layer 25 may have a multi-quantum well (MQW) structure and the composition of the active layer 25 may be determined so as to emit light having a desired peak wavelength.

As illustrated in FIG. 1, the light emitting structure 29 including the n-type semiconductor layer 23, the active layer 25, and the p-type semiconductor layer 27 may have a shape of a vertical type light emitting diode. In particular, the n-type electrode 31 may be formed on an outer surface of the n-type semiconductor layer 23, and the p-type electrode 33 may be formed on an outer surface of the p-type semiconductor layer 27.

In addition, each of the n-type electrode 31 and the p-type electrode 33 may include an opaque metal. As shown in FIG. 1, since the n-type electrode 31 formed of the opaque metal is disposed to cover the entire n-type semiconductor layer 23, light generated in the active layer 25 may be reflected by the n-type electrode 31 and discharged through a side surface of the n-type semiconductor layer 23 even when passing through the n-type semiconductor layer 23.

Although the p-type electrode 33 covers the entire p-type semiconductor layer 27, the p-type semiconductor layer 27 may form electrical contact in certain area. That is, as shown in FIG. 1, the insulating layer 37 may be disposed between the p-type electrode 33 and the p-type semiconductor layer 27. The insulating layer 37 is disposed to expose only a portion of the p-type semiconductor layer 27 while covering the remaining portion of the p-type semiconductor layer 27. Further, the p-type electrode 33 may electrically contact a portion of the p-type semiconductor layer 27 exposed through the insulating layer 37. In this manner, since the electrical contact area between the p-type electrode 33 and the p-type semiconductor layer 27 is reduced, it is possible to maintain current density at a certain level, even when a small amount of current is supplied through the p-type electrode 33. Here, the region of the p-type semiconductor layer 27 exposed through the insulating layer 37 may be placed at the center of the p-type semiconductor layer 27.

For example, when the p-type semiconductor layer 27 has a total area of 0 $\mu m^2$ to 100 $\mu m^2$, the region of the p-type semiconductor layer 27 exposed through the insulating layer 37 may have an area of 0.1 $\mu m^2$ to 25 $\mu m^2$. Further, the insulating layer 37 may include $SiO_2$.

As described above, when the n-type electrode 31, the insulating layer 37, and the p-type electrode 33 are disposed to cover the entire n-type semiconductor layer 23 and the p-type semiconductor layer 27, light emitted from the active layer 25 may be discharged only through the side surface of the light emitting structure 29, rather than being discharged towards the n-type semiconductor layer 23 or the p-type semiconductor layer 27 (e.g., in the vertical direction). Here, the n-type electrode 31 and the p-type electrode 33 may include metal (for example, Al or Ag) that may improve reflection efficiency while allowing power supply to the light emitting structure 29 therethrough.

The support substrate 114 may support the light emitting diode part 110. The support substrate 114 may be an insulating substrate, a conductive substrate, or a printed circuit board. For example, the support substrate 114 may be at least one of a sapphire substrate, a gallium nitride substrate, a glass substrate, a silicon carbide substrate, a silicon substrate, a metal substrate, and a ceramic substrate. According to the present exemplary embodiment, the support substrate 114 may be a transparent substrate that allows light emitted from the light emitting diodes 112 to pass therethrough. For example, the support substrate 114 may be a flexible glass substrate having a predetermined thickness.

The support substrate 114 may be a transparent substrate and one surface thereof may be coupled to the phosphor layer 126. The support substrate 114 may be coupled to the phosphor layer 126 via a transparent bonding layer (not shown).

The phosphor layer 126 may be disposed between the support substrate 114 and the plurality of light emitting diodes 112, and may include a blue phosphor layer 126a, a green phosphor layer 126b, and a red phosphor layer 126c. The blue phosphor layer 126a, the green phosphor layer 126b, and the red phosphor layer 126c may be alternately arranged to be adjacent to each other, and may be separated from each other by a predetermined distance or more. A blocking layer 126d may be disposed between the blue phosphor layer 126a, the green phosphor layer 126b, and the red phosphor layer 126c. Accordingly, the blocking layer 126d may prevent mixture of colors by blocking light having entered the blue phosphor layer 126a, the green phosphor layer 126b, or the red phosphor layer 126c from entering other phosphor layers.

According to an exemplary embodiment, the light emitting diodes 112 may be UV light emitting diodes. Accordingly, the blue phosphor layer 126a emits blue light through wavelength conversion of UV light emitted from the light emitting diodes 112, and the green phosphor layer 126b emits green light through wavelength conversion of UV light emitted from the light emitting diodes 112. The red phosphor layer 126c emit red light through wavelength conversion of UV light emitted from the light emitting diodes 112.

When the light emitting diodes 112 are blue light emitting diodes, a transparent layer may be provided at where the blue phosphor layer 126a is disposed. As such, blue light emitted from the light emitting diodes 112 may be discharged to the outside through the transparent layer without wavelength conversion.

Further, the transparent electrode 116 may be disposed between the phosphor layer 126 and the plurality of light emitting diodes 112. The transparent electrode 116 may have one surface directly adjoining the plurality of light emitting diodes 112, and the other surface coupled to the phosphor layer 126. The plurality of light emitting diodes 112 may be coupled to the transparent electrode 116 via a separate bonding portion, and a transparent bonding layer may be interposed between the transparent electrode 116 and the phosphor layer 126.

The transparent electrode 116 may electrically contact the n-type electrodes 31 of the light emitting diodes 112, and may also electrically contact the first reflective electrodes 117a. Accordingly, power supplied from the first reflective electrodes 117a may be supplied to the n-type electrodes 31. According to the present exemplary embodiment, the transparent electrode 116 may be transparent to allow light emitted from the light emitting diode 112 to be discharged towards the phosphor layer 126 therethrough, and may formed to be as thin as possible. The transparent electrode 116 may include indium tin oxide (ITO).

The first and second reflective electrodes 117a and 117b may have a predetermined thickness, and may be disposed to surround the light emitting diodes 112. The first reflective electrode 117a is disposed to surround the side surface of the light emitting diode 112 and the second reflective electrode 117b is disposed to electrically contact the p-type electrode 33 of the light emitting diode 112. The size of one subpixel may be determined by the first and second reflective electrodes 117a and 117b.

The first reflective electrode 117a is separated from the side surface of the light emitting diode 112 by a predetermined distance, and may have an inclined side surface facing the light emitting diode 112, as shown in FIG. 1. Here, the inclined side surface of the first reflective electrode 117a may be sloped to reflect light emitted from the light emitting diode 112 towards the transparent electrode 116.

The first reflective electrode 117a may have a sidewall to define a region for one subpixel, and may be integrally formed with a sidewall of an adjacent subpixel. That is, the first reflective electrodes 117a are disposed to divide the transparent electrode 116 into a plurality of regions while adjoining the transparent electrode 116. In the display apparatus 100, the plural regions correspond to subpixels, respectively, and at least one light emitting diode 112 may be disposed in each subpixel.

The second reflective electrode 117b may be electrically connected to the p-type electrode 33 of the light emitting diode 112, and may have a plate shape. The second reflective electrode 117b is disposed to cover the entire p-type electrode 33, and may have a larger area than the light emitting diode 112. As such, light emitted from the light emitting diode 112 may be reflected towards the transparent electrode 116 by the second reflective electrode 117b. The second reflective electrode 117b may be separated from the first reflective electrode 117a by a predetermined distance or more, so as to be electrically insulated therefrom.

According to the present exemplary embodiment, the first and second reflective electrodes 117a and 117b may be connected to a power source to supply power to the light emitting diodes 112, and include a material capable of reflecting light. To this end, each of the first and second reflective electrodes 117a and 117b may include metal.

The first connection electrode 119 is interposed between the p-type electrode 33 and the second reflective electrode 117b, and electrically connects the p-type electrode 33 to the second reflective electrode 117b. According to the present exemplary embodiment, the first connection electrode 119 may have the same width as the p-type electrode 33, and a greater thickness than the p-type electrode 33.

The encapsulation layer 125 may fill the subpixels defined by the first and second reflective electrodes 117a and 117b. With this structure, the encapsulation layer 125 may be disposed to cover all of the light emitting diodes 112. According to the present exemplary embodiment, the encapsulation layer 125 may include a transparent and electrically insulating material. Thus, light emitted from the light emitting diodes 112 may be discharged through the encapsulation layer 125.

The TFT panel part 130 is coupled to the light emitting diode part 110, and may supply power to the light emitting diode part 110. The TFT panel part 130 includes a panel substrate 132 and second connection electrodes 134. The TFT panel part 130 may control power supply to the light emitting diode part 110 in a manner such that only some of the light emitting diodes 112 in the light emitting diode part 110 emit light.

The panel substrate 132 may have a TFT drive circuit. The TFT drive circuit may be a circuit for driving an active matrix (AM) or a circuit for driving a passive matrix (PM).

The second connection electrodes 134 are electrically connected to the TFT drive circuit of the panel substrate 132 and to the second reflective electrodes 117b of the light emitting diode part 110. In this structure, power supplied through the TFT drive circuit may be supplied to each of the light emitting diodes 112 through the second connection electrodes 134 and the second reflective electrodes 117b. According to the present exemplary embodiment, the second connection electrodes 134 may be covered by a separate protective layer (not shown), which may include, for example, $SiN_x$.

The anisotropic conductive film 150 may electrically connect the light emitting diode part 110 to the TFT panel part 130. The anisotropic conductive film 150 may include an adhesive organic insulating material and conductive particles uniformly dispersed therein to achieve electrical connection. The anisotropic conductive film 150 exhibits conductivity in the thickness direction (e.g., vertical direction) and insulating properties in the plane direction (e.g., horizontal direction). In addition, the anisotropic conductive film 150 exhibits adhesive properties. Thus, the anisotropic conductive film 150 may be used to bond the light emitting diode part 110 to the TFT panel part 130, such that the light emitting diode part 110 may be electrically connected to the TFT panel part 130 through the anisotropic conductive film 150.

Particularly, the anisotropic conductive film 150 may be advantageously used to connect ITO electrodes, which are known to be difficult to solder at high temperature.

As such, when the light emitting diodes 112 are coupled to the TFT panel part 130 via the anisotropic conductive film 150, the second reflective electrodes 117b may be electrically connected to the second connection electrodes 134 of the TFT panel part 130 via an electrode connection portion 152.

According to the present exemplary embodiment, the light emitting diode part 110 and the TFT panel part 130 may be separately manufactured, and coupling between the light emitting diode part 110 and the TFT panel part 130 will be described in more detail below.

FIGS. 2A to 2G are cross-sectional views illustrating a process of manufacturing the light emitting diodes of the display apparatus of FIG. 1.

Figure 2A:
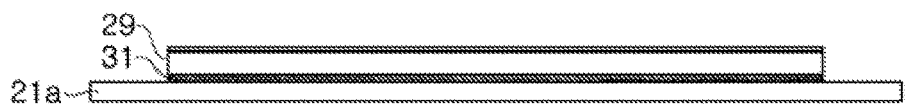
FIG. 2A, FIG. 2B, FIG. 2C, FIG. 2D, FIG. 2E, FIG. 2F, and FIG. 2G are cross-sectional views illustrating a process of manufacturing light emitting diodes of the display apparatus of FIG. 1.

The process of manufacturing the plurality of light emitting diodes 112 will be described in more detail with reference to FIGS. 2A to 2G. Referring to FIG. 2A, an n-type electrode 31 having a predetermined area is disposed on a first manufacturing substrate 21a, and a light emitting structure 29, which includes sequentially stacked an n-type semiconductor layer 23, an active layer 25, and a p-type semiconductor layer 27, is disposed on the n-type electrode 31. The first manufacturing substrate 21a may be a sapphire substrate, a gallium nitride substrate, a glass substrate, a silicon carbide substrate, a silicon substrate, a metal substrate, a ceramic substrate, or the like.

Figure 2B:

Then, referring to FIG. 2B, an insulating layer 37 is formed to a predetermined thickness on the p-type electrode 33. Thereafter, the insulating layer 37 is etched to form holes that expose the p-type semiconductor layer 27 at locations corresponding to light emitting diodes 112. A p-type electrode 33 is formed on the insulating layer 37 so as to cover the entire insulating layer 37 and the holes formed in the insulating layer 37. With this structure, the p-type electrode 33 may electrically contact the p-type semiconductor layer 27 through the holes.

Figure 2C:
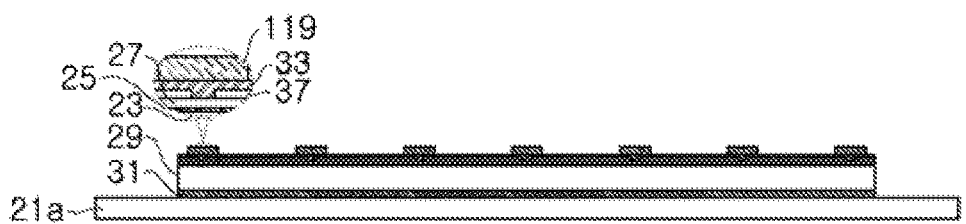

Referring to FIG. 2C, a plurality of first connection electrodes 119 is disposed on the p-type electrode 33. The first connection electrodes 119 may be disposed on the holes formed in the insulating layer 37, respectively. The plurality of first connection electrodes 119 may be separated from each other on the p-type electrode 33 by a predetermined distance or more.

Figure 2D:
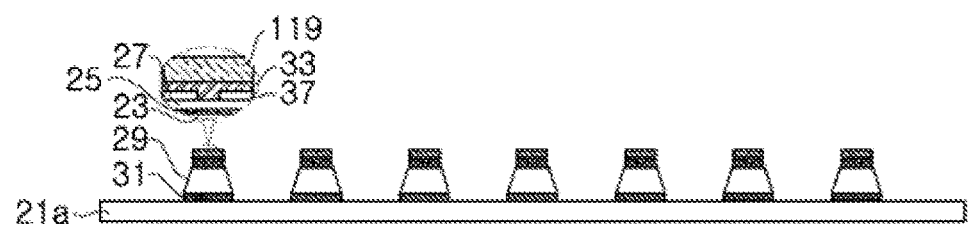

After formation of the first connection electrodes 119, the p-type electrode 33, the insulating layer 37, the p-type semiconductor layer 27, the active layer 25, the n-type semiconductor layer 23, and the n-type electrode 31 are etched with respect to each of the first connection electrodes 119. As such, a plurality of light emitting diodes 112 may be formed on the first manufacturing substrate 21a, as shown in FIG. 2D. According to the present exemplary embodiment, each of the light emitting diodes 112 may include a light emitting structure 29 having a trapezoidal shape formed by etching.

Figure 2E:
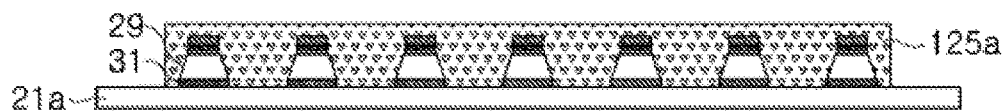
Figure 2F:
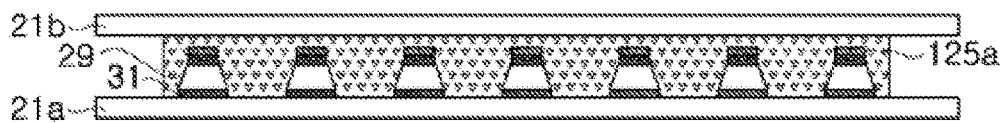
Figure 2G:

In order to transfer the plurality of light emitting diodes 112 to the support substrate 114, the plurality of light emitting diodes 112 is covered with a filler 125a, as shown in FIG. 2E. Then, referring to FIG. 2F, a second manufacturing substrate 21b is bonded to an upper side of the filler 125a. The second manufacturing substrate 21b may be the same substrate as the first manufacturing substrate 21a, or may be a different substrate than the first manufacturing substrate 21a as needed. After the second manufacturing substrate 21b is coupled to the upper side of the filler 125a, the first manufacturing substrate 21a is removed, as shown in FIG. 2G.

FIGS. 3A to 3D are cross-sectional views illustrating a process of manufacturing a phosphor layer of the display apparatus of FIG. 1.

Figure 3A:
FIG. 3A, FIG. 3B, FIG. 3C, FIG. 3D, and FIG. 3E are cross-sectional views illustrating a process of manufacturing a phosphor layer of the display apparatus of FIG. 1.
Figure 3B:
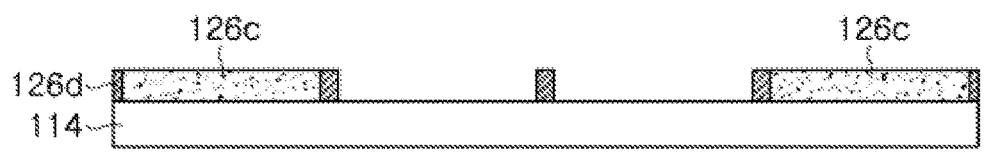

The phosphor layer 126 that is to be coupled to the plurality of light emitting diodes 112 may be formed independent to the plurality of light emitting diodes 112 manufactured illustrated with reference to FIGS. 2A to 2G. Referring to FIG. 3A, the blocking layer 126d is formed in plural regions arranged at constant intervals on the support substrate 114, and each region between the regions for the blocking layer 126d corresponds to a subpixel of the display apparatus 100.

After the blocking layer 126d is formed on the support substrate 114, a red phosphor layer 126c may be formed in plural regions defined by the regions, in which the blocking layer 126d is formed. The red phosphor layer 126c is formed in a plurality of regions arranged at constant intervals, and may be formed by dotting a liquid resin containing red phosphors, followed by curing.

Figure 3C:
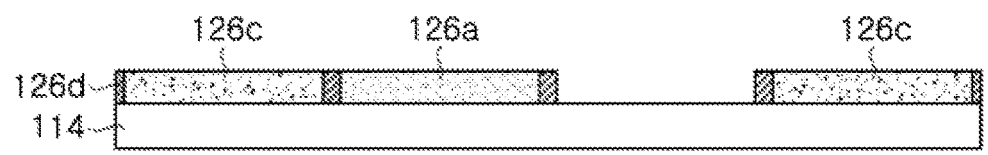
Figure 3D:
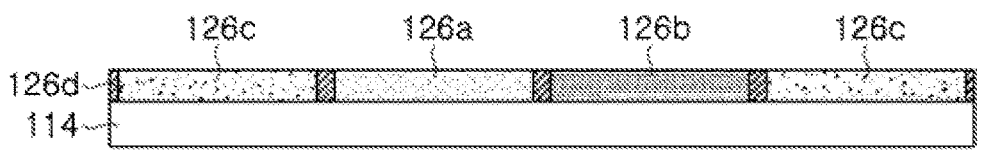

Then, as in the process of forming the red phosphor layer 126c, each of a blue phosphor layer 126a and a green phosphor layer 126b are formed, as shown in FIG. 3C and FIG. 3D. According to the present exemplary embodiment, when the light emitting diodes 112 are blue light emitting diodes, a transparent encapsulation layer 125 may be formed instead of the blue phosphor layer 126a.

Figure 3E:
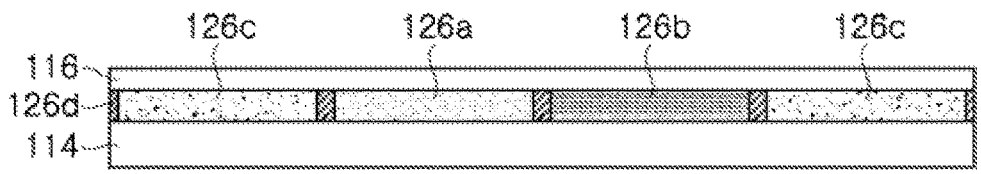

As described above, after all of the phosphor layers 126a, 126b, and 126c are formed, a transparent electrode 116 may be disposed on the phosphor layer 126, as shown in FIG. 3E. The transparent electrode 116 may supply power to the light emitting diodes 112 and also protect the phosphor layer 126.

FIGS. 4A to 4F are cross-sectional views illustrating a process of manufacturing the light emitting diode part of the display apparatus of FIG. 1.

Figure 4A:
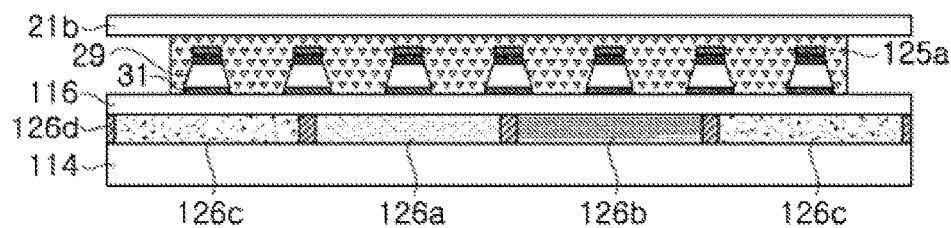
FIG. 4A, FIG. 4B, FIG. 4C, FIG. 4D, FIG. 4E, and FIG. 4F are cross-sectional views illustrating a process of manufacturing a light emitting diode part of the display apparatus of FIG. 1.

The light emitting diode part 110 may be manufactured by coupling the light emitting diodes 112 and the phosphor layer 126 manufactured as shown in FIGS. 2A to 3E. As shown in FIG. 4A, the plurality of light emitting diodes 112 disposed on the second manufacturing substrate 21b is brought into contact with the transparent electrode 116, to which a bonding agent may be applied. The bonding agent may be deposited only on some portions of the transparent electrode 116 that correspond to a location at which the phosphor layer 126 is formed. As such, among the plurality of light emitting diodes 112, only the light emitting diodes 112 contacting the bonding agent may be coupled to the transparent electrode 116.

Figure 4B:
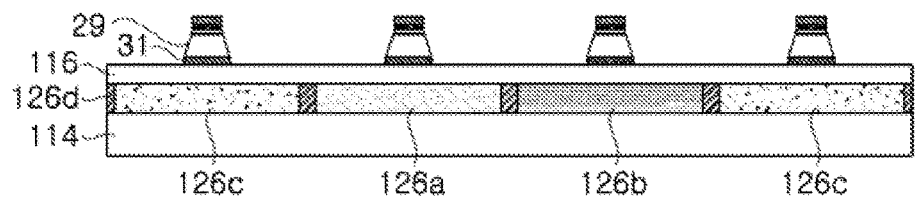

FIG. 4B shows the plurality of light emitting diodes 112 coupled to the transparent electrode 116. As illustrated in FIG. 4B, the plurality of light emitting diodes 112 may be coupled to the transparent electrode 116 such that one light emitting diode 112 is provided to one subpixel.

Figure 4C:
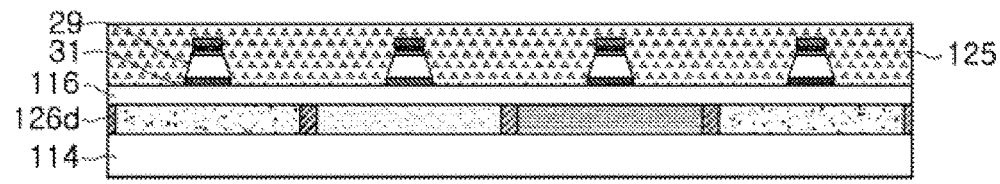

After the light emitting diodes 112 are coupled to the transparent electrode 116, the encapsulation layer 125 may be formed to cover each of the light emitting diodes 112 and the transparent electrode 116. The encapsulation layer 125 may include an electrically insulating material and may be transparent. FIG. 4C shows the encapsulation layer 125 formed to cover each of the light emitting diodes 112.

Figure 4D:
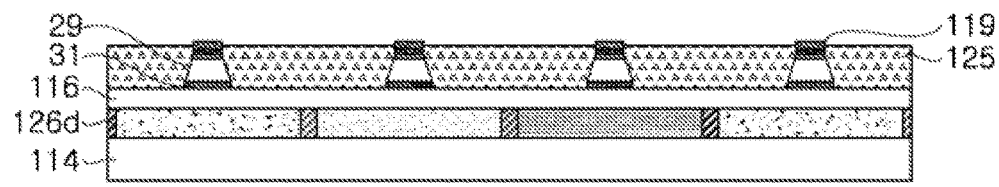

Next, referring to FIG. 4D, the encapsulation layer 125 is etched to expose upper surfaces of the first connection electrodes 119. Etching of the encapsulation layer 125 may be performed to expose part of the first connection electrodes 119 without exposing the p-type electrode 33 or the p-type semiconductor layer 27.

Figure 4E:
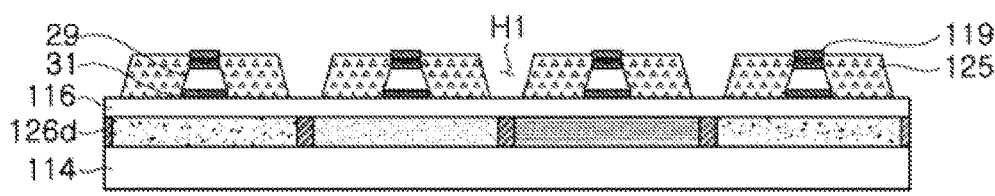

Then, referring to FIG. 4E, with reference to the exposed regions of the first connection electrode 119, each region between the light emitting diodes 112 is etched to form a first hole H1. The shape of the subpixel may be determined by the first hole H1. That is, since the encapsulation layer 125 is etched such that an inner side surface of the first hole H has an inclined surface, a plurality of mesas may be formed on the transparent electrode 116. According to the present exemplary embodiment, one mesa may include at least one light emitting diode 112 therein, and the encapsulation layer 125 may surround at least one light emitting diode 112.

Figure 4F:
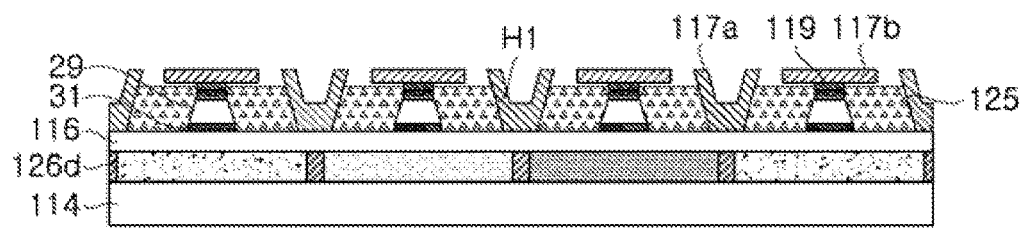

After the first holes H1 are formed as described above, second reflective electrodes 117b are formed on the first connection electrodes 119, as shown in FIG. 4F. The second reflective electrodes 117b may have a plate shape having a greater width than the light emitting diodes 112. Further, each of the first reflective electrodes 117a may be formed in the first hole H1 so as to correspond to the shape of the first hole H1. The first reflective electrode 117a may have an inclined side surface corresponding to the shape of the first hole H1, and may have the same height as a distance from the transparent electrode 116 to an upper surface of the second reflective electrode 117b.

As the first and second reflective electrodes 117a and 117b are formed as described above, manufacture of the light emitting diode part 110 is completed.

Figure 5A:
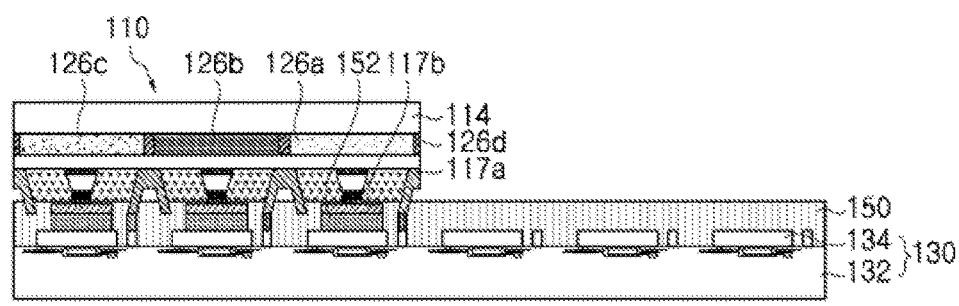
FIG. 5A and FIG. 5B are cross-sectional views illustrating a process of coupling a TFT panel part to the light emitting diode part of the display apparatus of FIG. 1.
Figure 5B:
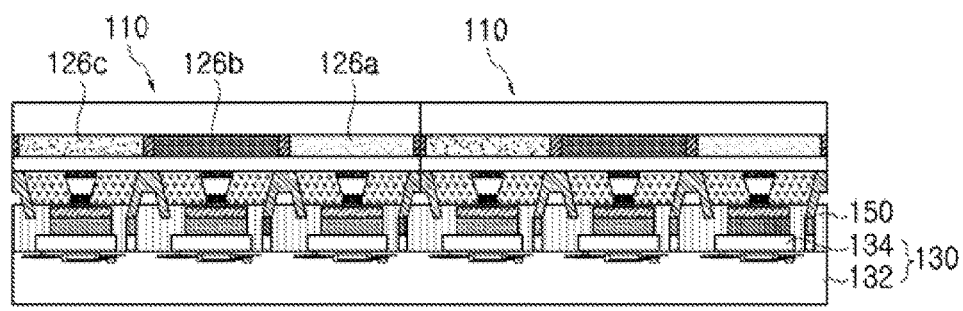

FIGS. 5A and 5B are cross-sectional views illustrating a process of coupling a TFT panel part to the light emitting diode part of the display apparatus of FIG. 1.

After completion of manufacture of the light emitting diode part 110 through the processes shown in FIGS. 2A to 4F, the light emitting diode part 110 is coupled to a separate TFT panel part 130, and shown in FIGS. 5A and 5B.

The TFT panel part 130 may be manufactured in a large area, and may be provided with a second connection electrode 134 and a TFT circuit at a location corresponding to each subpixel. Thus, as shown in FIG. 5A, a light emitting diode part 110 having a smaller size than the TFT panel part 130 is coupled to part of the TFT panel part 130. According to the present exemplary embodiment, the TFT panel part 130 has an anisotropic conductive film 150 attached to an upper side thereof. The light emitting diode part 110 is disposed on the anisotropic conductive film 150, such that the second reflective electrodes 117b adjoin the second connection electrodes 134. In addition, the light emitting diode part 110 is coupled to the TFT panel part 130 by imparting force from above the light emitting diode part 110 towards the TFT panel part 130, such that the anisotropic conductive film 150 is compressed to electrically connect the second reflective electrodes 117b to the second connection electrodes 134.

Then, referring to FIG. 5B, another light emitting diode part 110 may be coupled to the TFT panel part 130, thereby providing a display apparatus 100.

Figure 6:
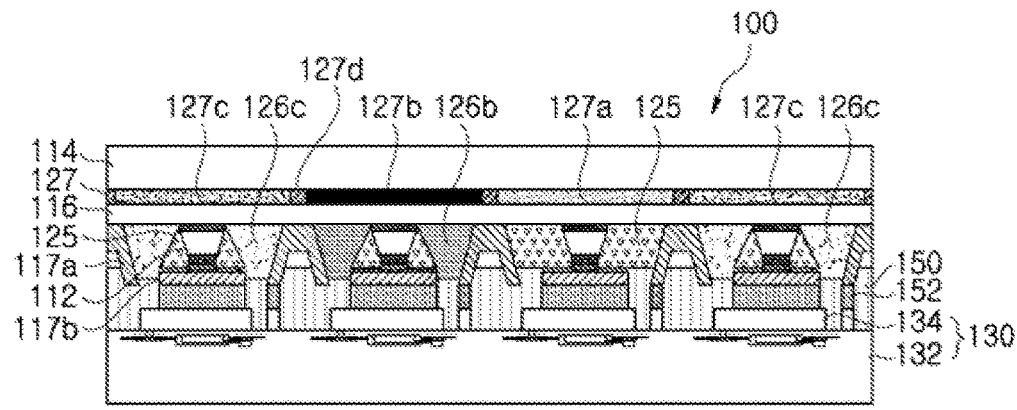
FIG. 6 is a cross-sectional view of a display apparatus according to an exemplary embodiment.

FIG. 6 is a cross-sectional view of a display apparatus according to an exemplary embodiment.

Referring to FIG. 6, the display apparatus 100 according to the present exemplary embodiment includes a light emitting diode part 110, a TFT panel part 130, and an anisotropic conductive film 150.

The light emitting diode part 110 includes light emitting diodes 112, a support substrate 114, a color filter 127, a transparent electrode 116, first reflective electrodes 117a, second reflective electrodes 117b, first connection electrodes 119, a phosphor layer 126, and an encapsulation layer 125. The display apparatus 100 includes elements that are substantially similar to those of the display apparatus illustrated in FIG. 1. Thus, repeated description of the substantially similar elements will be omitted.

According to the present exemplary embodiment, the color filter 127 may be interposed between the support substrate 114 and the transparent electrode 116. The color filter 127 may include a blue light portion 127a, a green light portion 127b, a red light portion 127c, and a light blocking portion 127d. The color filter 127 may be formed in a film shape and may block light having passed through the color filter 127 excluding light of a predetermined wavelength.

In particular, the blue light portion 127a allows only blue light to pass therethrough by blocking light having wavelengths other than the wavelength of blue light, and the green light portion 127b allows only green light to pass therethrough by blocking light having wavelengths other than the wavelength of green light. The red light portion 127c allows only red light to pass therethrough by blocking light having wavelengths other than the wavelength of red light. The light blocking portion 127d is disposed between the blue light portion 127a, the green light portion 127b, and the red light portion 127c, and blocks all fractions of light.

In addition, a region defined by each of the first reflective electrodes 117a may be provided with the encapsulation layer 125 alone, the encapsulation layer 125 and the green phosphor layer 126b, or the encapsulation layer 125 and the red phosphor layer 126c. The encapsulation layer 125 is disposed to surround a side surface of the light emitting diode 112. Each of the green phosphor layer 126b and the red phosphor layer 126c may be disposed to surround the encapsulation layer 125. With this structure, the green phosphor layer 126b and the red phosphor layer 126c may be disposed between the encapsulation layer 125 and the first reflective electrode 117a.

According to the present exemplary embodiment, the blue light emitting diodes are used as the light emitting diodes 112. Hereinafter, the structure of the light emitting diode part 110 is described as including the encapsulation layer 125, rather than including a separate blue phosphor layer 126a.

Specifically, referring to FIG. 6, in the first subpixel (left-foremost), the encapsulation layer 125 is disposed to surround the side surface of the light emitting diode 112, and the red phosphor layer 126c is disposed between the encapsulation layer 125 and the first reflective electrode 117a. In addition, the red light portion 127c of the color filter 127 is disposed above the light emitting diode 112. In this structure, blue light emitted through the side surface of the light emitting diode 112 passes through the encapsulation layer 125 and is converted into red light through the red phosphor layer 126c. Light converted into red light through the red light portion 127c of the color filter 127 is discharged outside through the transparent electrode 116.

Referring again to FIG. 6, in the second subpixel adjacent to the first subpixel, the encapsulation layer 125 is disposed to surround the side surface of the light emitting diode 112 and the green phosphor layer 126b is disposed between the encapsulation layer 125 and the first reflective electrode 117a. In addition, the green light portion 127b of the color filter 127 is disposed above the light emitting diode 112. In this structure, blue light emitted through the side surface of the light emitting diode 112 passes through the encapsulation layer 125 and is converted into green light through the green phosphor layer 126b, whereby only the green light may be discharged outside through the green light portion 127b.

In the third subpixel adjacent to the second subpixel, only the encapsulation layer 125 is disposed between the blue light emitting diode and the first reflective electrode 117a. In addition, the blue light portion 127a of the color filter 127 is disposed above the light emitting diodes 112. In this structure, blue light emitted through the side surface of the light emitting diode 112 passes through the encapsulation layer 125 without wavelength conversion, whereby only the blue light may be discharged outside through the blue light portion 127a.

As described above, the display apparatus 100 of FIG. 6 is described as utilizing the blue light emitting diodes as the light emitting diodes 112. Thus, the description is given of the structure wherein the third subpixel is provided only with the encapsulation layer 125. However, it should be understood that, when UV light emitting diodes are used as the light emitting diodes 112, the blue phosphor layer 126a may be disposed together with the encapsulation layer 125, and UV light emitted from the light emitting diodes 112 is converted into blue light through the blue phosphor layer 126a, and only the blue light may be discharged outside through the blue light portion 127a.

FIGS. 7A to 7E are cross-sectional views illustrating a process of manufacturing the light emitting diode part of the display apparatus of FIG. 6. FIGS. 8A and 8B are cross-sectional views illustrating a process of coupling a TFT panel part to the light emitting diode part of the display apparatus of FIG. 6.

Figure 7A:
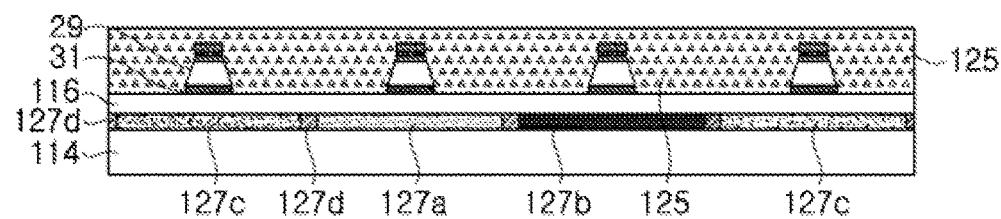
FIG. 7A, FIG. 7B, FIG. 7C.

Referring to FIGS. 7A to 7E, the process of manufacturing the light emitting diode part 110 of FIG. 6 will be described. FIG. 7A corresponds to FIG. 4C, and the processes prior to this process are similar to those of the light emitting diode part 110 of FIG. 1. The light emitting diode part 110 of FIG. 6 is different from the light emitting diode part of FIG. 1, in that the color filter 127 is disposed at the location of the phosphor layer 126.

More particularly, FIG. 7A shows a structure where a plurality of light emitting diodes 112 is disposed on the transparent electrode 116 having the color filter 127 at a lower side thereof, and an encapsulation layer 125 is formed to cover the plurality of light emitting diodes 112.

Figure 7B:
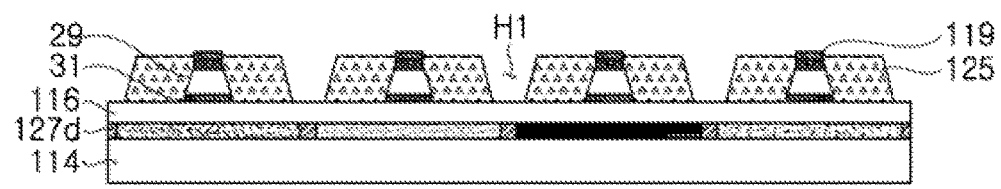
Figure 8A:
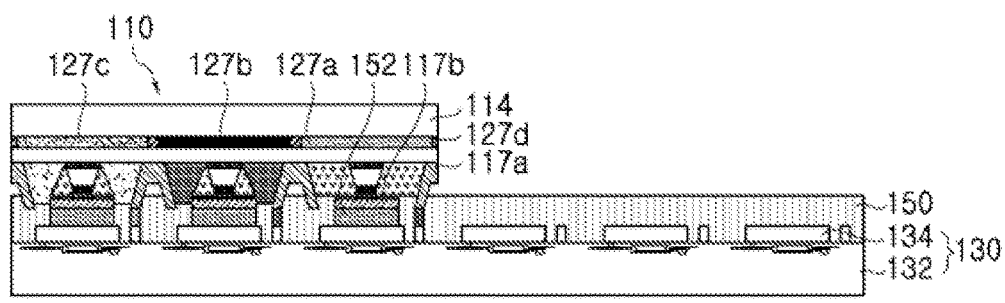
FIG. 8A and FIG. 8B are cross-sectional views illustrating a process of coupling a TFT panel part to the light emitting diode part of the display apparatus of FIG. 6.
Figure 8B:
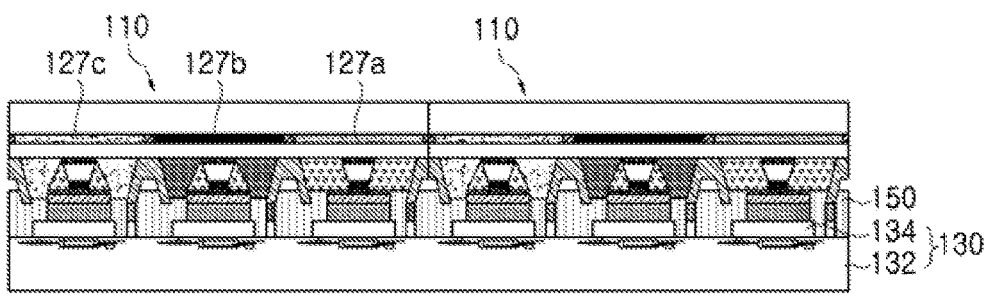

After forming the encapsulation layer 125, the encapsulation layer 125 is etched to expose an upper side of the first connection electrode 119 of each of the light emitting diodes 112, and first holes H1 are formed between the light emitting diodes 112, as shown in FIG. 7B.

Figure 7C:
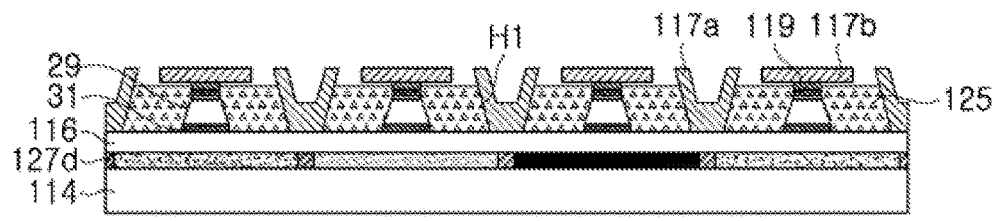

Then, as shown in FIG. 7C, a second reflective electrode 117b is disposed on each of the first connection electrodes 119, and a first reflective electrode 117a is formed in each of the first holes H1.

Figure 7D:
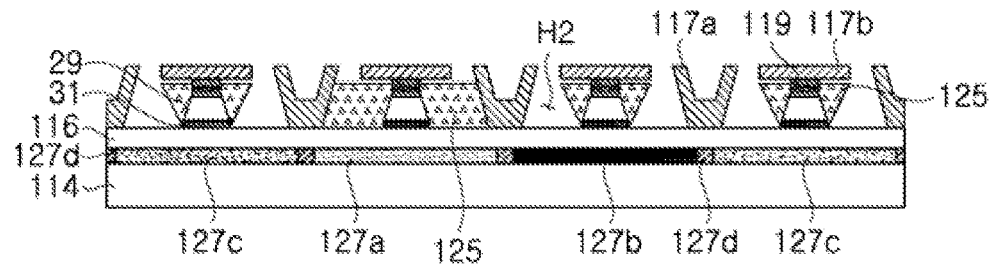
FIG. 7D, and FIG. 7E are cross-sectional views illustrating a process of manufacturing a light emitting diode part of the display apparatus of FIG. 6.

After forming the first and second reflective electrodes 117a and 117b, second holes H2 are formed by etching the encapsulation layer 125 disposed at the sides of the light emitting diodes 112 through spaces between the first reflective electrodes 117a and the second reflective electrodes 117b, as shown in FIG. 7D. According to the present exemplary embodiment, blue light emitting diodes are used as the light emitting diodes 112, and thus, the second holes H2 are formed by etching the encapsulation layer 125 at the sides of the light emitting diodes 112 excluding the light emitting diodes 112 disposed at a location corresponding to a blue light portion 127a of the color filter 127.

According to an exemplary embodiment, when UV light emitting diodes are used as the light emitting diodes 112, the second holes H2 are formed in all of the subpixels.

Figure 7E:
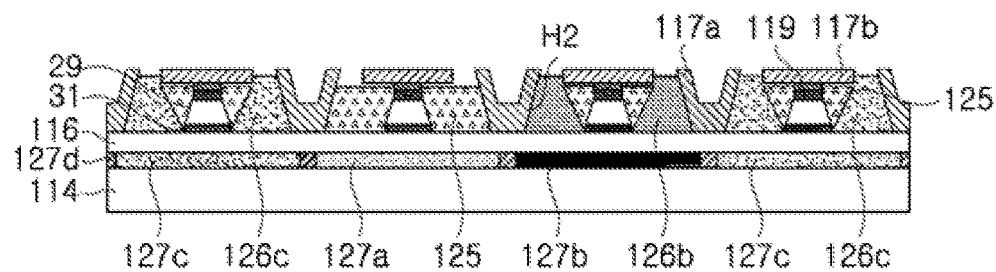

After the second holes H2 are respectively formed on the subpixels as described above, each of a green phosphor layer 126b and a red phosphor layer 126c is formed to fill the corresponding second hole H2, as shown in FIG. 7E. According to the present exemplary embodiment, the green phosphor layer 126b fills the second hole H2 formed above the green light portion 127b of the color filter 127, and the red phosphor layer 126c fills the second hole H2 formed above the red light portion 127c of the color filter 127. In addition, the second hole H2 is not formed above the blue light portion 127a of the color filter 127 as blue light emitting diodes are used, and the encapsulation layer 125 is disposed above the blue light portion 127a.

As such, the phosphor layer 126 is formed on each of the subpixels as described above, thereby completing manufacture of the light emitting diode part 110. Then, the display apparatus 100 may be manufactured by coupling the manufactured light emitting diode part 110 to a large TFT panel part 130, as shown in FIG. 7A and FIG. 7B.

Figure 9:
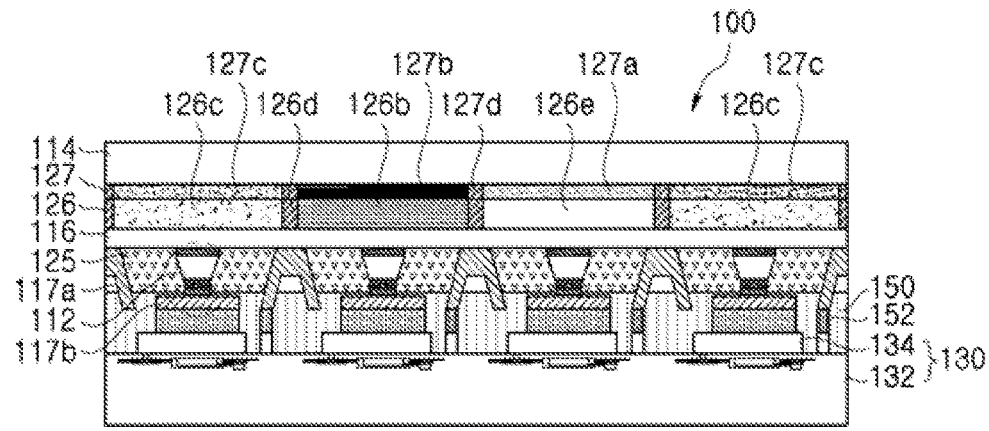
FIG. 9 is a cross-sectional view of a display apparatus according to an exemplary embodiment.

FIG. 9 is a cross-sectional view of a display apparatus according to an exemplary embodiment.

Referring to FIG. 9, the display apparatus 100 according to the present exemplary embodiment includes a light emitting diode part 110, a TFT panel part 130, and an anisotropic conductive film 150.

The light emitting diode part 110 includes light emitting diodes 112, a support substrate 114, a color filter 127, a phosphor layer 126, a transparent electrode 116, first reflective electrodes 117a, second reflective electrodes 117b, first connection electrodes 119, and an encapsulation layer 125. The light emitting diode part 110 of FIG. 9 includes elements that are substantially similar to those of the light emitting diode part of FIG. 6, and thus, repeated description to substantially similar elements will be omitted.

According to the present exemplary embodiment, the color filter 127 and the phosphor layer 126 may be interposed between the support substrate 114 and the transparent electrode 116. The color filter 127 may include a blue light portion 127a, a green light portion 127b, a red light portion 127c, and a light blocking portion 127d. The color filter 127 may be formed in a film shape and may block light having passed through the color filter 127 excluding light of a predetermined wavelength.

The phosphor layer 126 is interposed between the color filter 127 and the transparent electrode 116, and may emit light through wavelength conversion of light entering the phosphor layer 126 or without wavelength conversion. That is, the phosphor layer 126 according to the present exemplary embodiment may include a green phosphor layer 126b, a red phosphor layer 126c, a blocking layer 126d, and a transparent layer. The green phosphor layer 126b is disposed at a location corresponding to the green light portion 127b of the color filter 127, and the red phosphor layer 126c is disposed at a location corresponding to the red light portion 127c of the color filter 127. The transparent layer is disposed at a location corresponding to the blue light portion 127a of the color filter 127.

Since the blue light emitting diodes are used as the light emitting diodes 112 in the present exemplary embodiment, the phosphor layer 126 includes the transparent layer. In the structure wherein UV light emitting diodes are used as the light emitting diodes 112, the blue phosphor layer 126a may be disposed in place of the transparent layer.

As in the light emitting diode part 110 of FIG. 1, the encapsulation layer 125 may be disposed between the light emitting diodes 112 and the first reflective electrode 117a.

Figure 10:
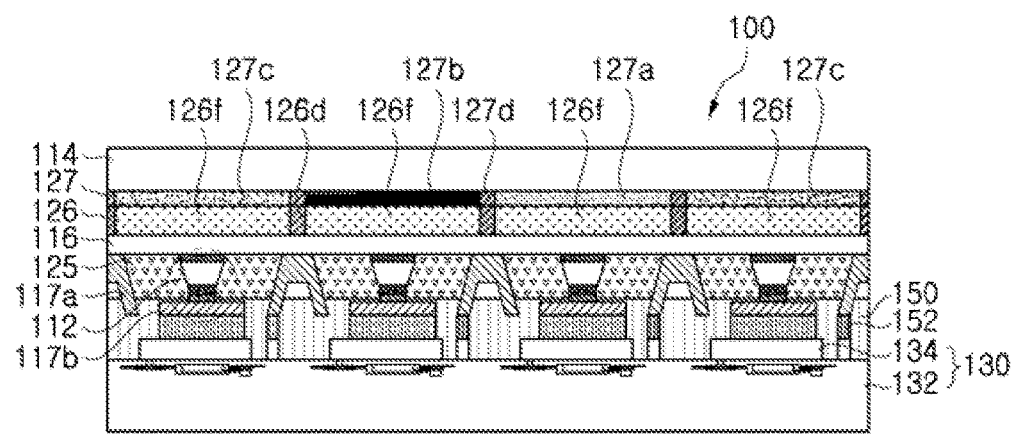
FIG. 10 is a cross-sectional view of a display apparatus according to an exemplary embodiment.

FIG. 10 is a cross-sectional view of a display apparatus according to an exemplary embodiment.

Referring to FIG. 10, the display apparatus 100 according to the present exemplary embodiment includes a light emitting diode part 110, a TFT panel part 130, and an anisotropic conductive film 150.

The light emitting diode part 110 includes light emitting diodes 112, a support substrate 114, a color filter 127, a white phosphor layer 126f, a transparent electrode 116, first reflective electrodes 117a, second reflective electrodes 117b, first connection electrodes 119, and an encapsulation layer 125. The light emitting diode part 110 of FIG. 10 includes elements that are substantially similar to those of the light emitting diode part of FIGS. 1, 6, and 9, and thus, repeated description to substantially similar elements will be omitted.

According to the present exemplary embodiment, the color filter 127 and the white phosphor layer 126f may be interposed between the support substrate 114 and the transparent electrode 116. The color filter 127 may include a blue light portion 127a, a green light portion 127b, a red light portion 127c, and a light blocking portion 127d.

The white phosphor layer 126f is interposed between the color filter 127 and the transparent electrode 116, and may emit white light through wavelength conversion of light entering the white phosphor layer 126f. In addition, the light blocking layer 126d may be disposed at a location corresponding to the light blocking portion 127d of the color filter 127.

By the color filter 127 and the white phosphor layer 126f, light emitted from each of the light emitting diodes 112 is discharged towards the transparent electrode 116 through the encapsulation layer 125, passes through the transparent electrode 116, and is converted into white light through wavelength conversion by the white phosphor layer 126f, such that white light is emitted to the color filter 127. As a result, light is discharged outside through the color filter 127 except for light having a predetermined wavelength.

More particularly, the blue light portion 127a of the color filter 127 allows only blue light to pass therethrough by blocking light having wavelengths other than the wavelength of blue light among white light passing therethrough, and the green light portion 127b of the color filter 127 allows only green light to pass therethrough by blocking light having wavelengths other than the wavelength of green light among white light passing therethrough. In addition, the red light portion 127c allows only red light to pass therethrough by blocking light having wavelengths other than the wavelength of red light among white light passing therethrough.

Figure 11:
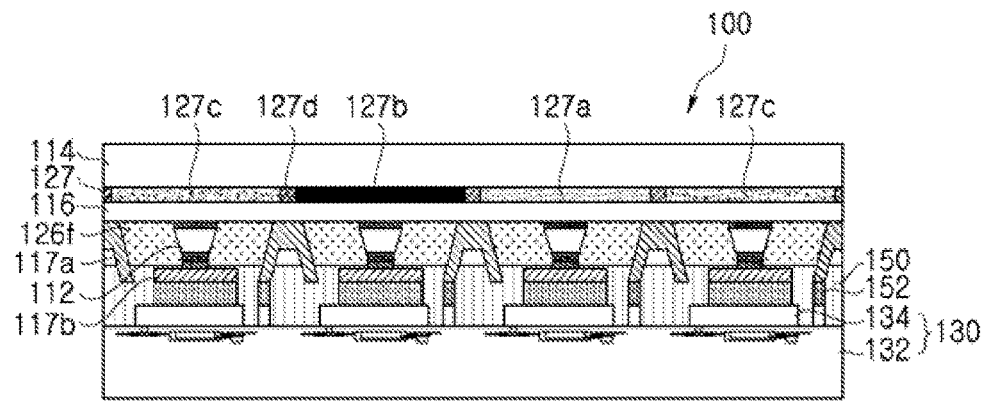
FIG. 11 is a cross-sectional view of a display apparatus according to an exemplary embodiment.

FIG. 11 is a cross-sectional view of a display apparatus according to an exemplary embodiment.

Referring to FIG. 11, the display apparatus 100 according to the present exemplary embodiment includes a light emitting diode part 110, a TFT panel part 130, and an anisotropic conductive film 150.

The light emitting diode part 110 includes light emitting diodes 112, a support substrate 114, a color filter 127, a transparent electrode 116, first reflective electrodes 117a, second reflective electrodes 117b, first connection electrodes 119, and a white phosphor layer 126f. The light emitting diode part 110 of FIG. 11 includes elements that are substantially similar to those of the light emitting diode part of FIG. 10, and thus, repeated description to substantially similar elements will be omitted.

In the present exemplary embodiment, the color filter 127 may be interposed between the support substrate 114 and the transparent electrode 116. As in the above exemplary embodiments, the color filter 127 may include a blue light portion 127a, a green light portion 127b, a red light portion 127c, and a light blocking portion 127d.

The white phosphor layer 126f may be disposed between the light emitting diode 112 and the first reflective electrode 117a. That is, the white phosphor layer 126f according to the present exemplary embodiment may be disposed at the location of the encapsulation layer 125 described above with reference to the light emitting diode part of FIG. 1, instead of the encapsulation layer 125. In this structure, light emitted from each of the light emitting diodes 112 is subjected to wavelength conversion while passing through the white phosphor layer 126f, such that white light can be discharged towards the transparent electrode 116.

Then, white light having passed through the transparent electrode 116 passes through the color filter 127 such that only blue light, green light, and red light may be discharged outside through the color filter.

Figure 12:
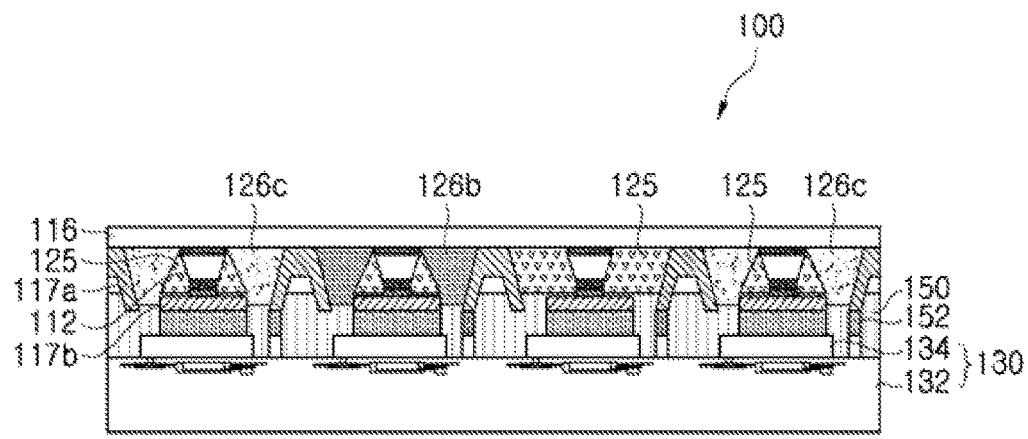
FIG. 12 is a cross-sectional view of a display apparatus according to an exemplary embodiment.

FIG. 12 is a cross-sectional view of a display apparatus according to an exemplary embodiment.

Referring to FIG. 12, the display apparatus 100 according to the present exemplary embodiment includes a light emitting diode part 110, a TFT panel part 130, and an anisotropic conductive film 150.

The light emitting diode part 110 includes light emitting diodes 112, a transparent electrode 116, first reflective electrodes 117a, second reflective electrodes 117b, first connection electrodes 119, a phosphor layer 126, and an encapsulation layer 125. The light emitting diode part 110 of FIG. 12 includes elements that are substantially similar to those of the light emitting diode part of FIG. 6, and thus, repeated description to substantially similar elements will be omitted.

The display apparatus 100 does not include the support substrate 114 and the color filter 127 of the display apparatus 100 illustrated in FIG. 6. That is, light emitted from each of the light emitting diodes 112 is blue light, which is converted into red light while passing through the encapsulation layer 125 and the red phosphor layer 126c. In addition, blue light emitted from the light emitting diodes 112 is converted into green light while passing through the encapsulation layer 125 and the green phosphor layer 126b. Further, a subpixel on which only the encapsulation layer 125 is disposed allows blue light emitted from the light emitting diodes 112 to be discharged outside through the encapsulation layer 125 without wavelength conversion.

Figure 13:
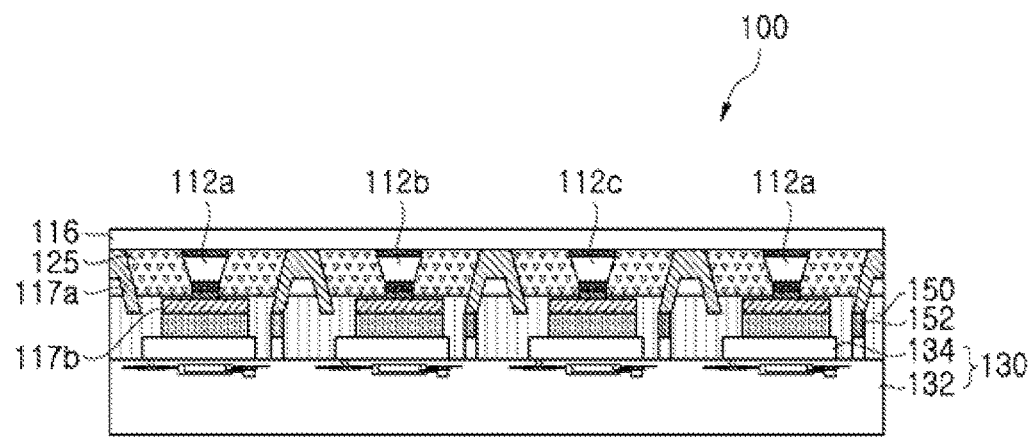
FIG. 13 is a cross-sectional view of a display apparatus according to an exemplary embodiment.

FIG. 13 is a cross-sectional view of a display apparatus according to an exemplary embodiment.

Referring to FIG. 13, the display apparatus 100 according to the present exemplary embodiment includes a light emitting diode part 110, a TFT panel part 130, and an anisotropic conductive film 150.

The light emitting diode part 110 includes blue light emitting diodes 112a, green light emitting diodes 112b, red light emitting diodes 112c, a transparent electrode 116, first reflective electrodes 117a, second reflective electrodes 117b, first connection electrodes 119, and an encapsulation layer 125. The light emitting diode part 110 of FIG. 13 includes elements that are substantially similar to those of the light emitting diode part of FIGS. 1 and 6, and thus, repeated description to substantially similar elements will be omitted.

Each of the blue light emitting diode 112a, the green light emitting diode 112b, and the red light emitting diode 112c is provided in plural and regularly arranged on the transparent electrode 116. The blue light emitting diodes 112*a*, the green light emitting diodes 112*b*, and the red light emitting diodes 112*c* may be disposed adjacent to one another and arranged at constant intervals in rows and columns.

In addition, one of the blue light emitting diode 112*a*, the green light emitting diode 112*b*, and the red light emitting diodes 112*c* is provided to one subpixel.

The encapsulation layer 125 is disposed to surround the side surface of each of the blue light emitting diodes 112*a*, the green light emitting diodes 112*b*, and the red light emitting diodes 112*c*. The encapsulation layer 125 may prevent damage to each of the light emitting diodes 112*a*, 112*b*, and 112*c* due to external environments and exhibit electrical insulating properties.

Accordingly, light emitted from the blue light emitting diodes 112*a*, the green light emitting diodes 112*b*, and the red light emitting diodes 112*c* may be discharged outside through the encapsulation layer 125 and the transparent electrode 116.

Figure 14:
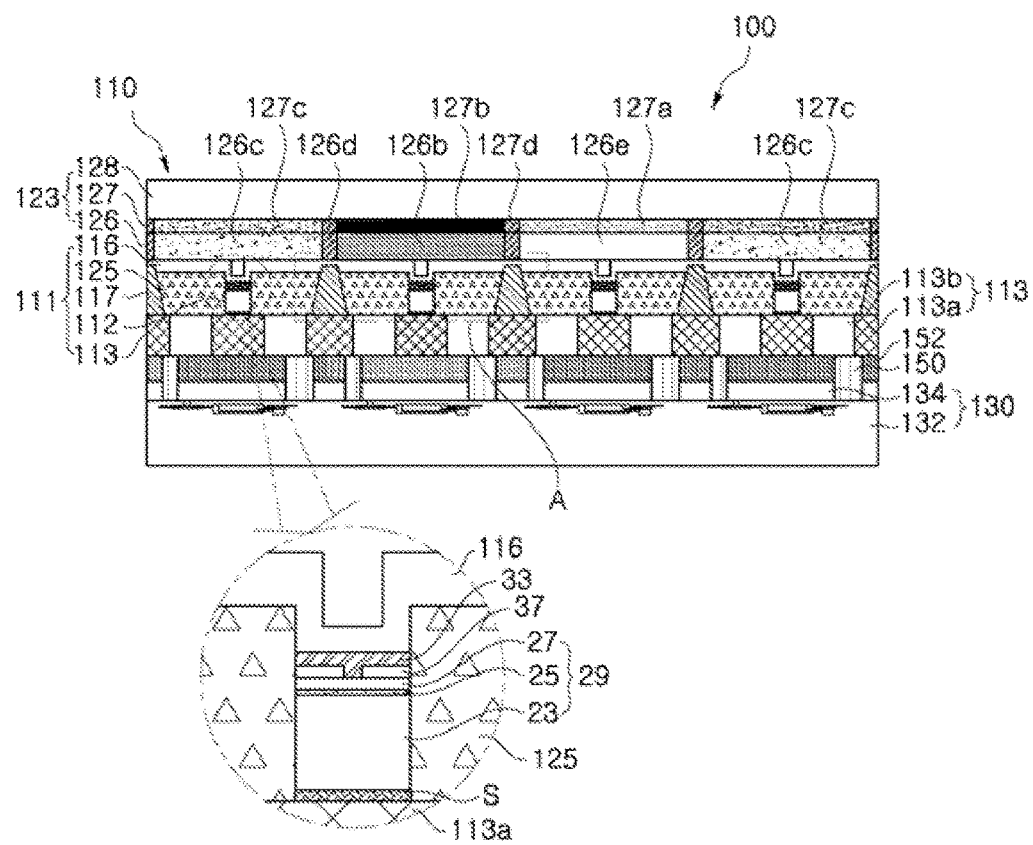
FIG. 14 is a cross-sectional view of a display apparatus according to an exemplary embodiment.
Figure 15:
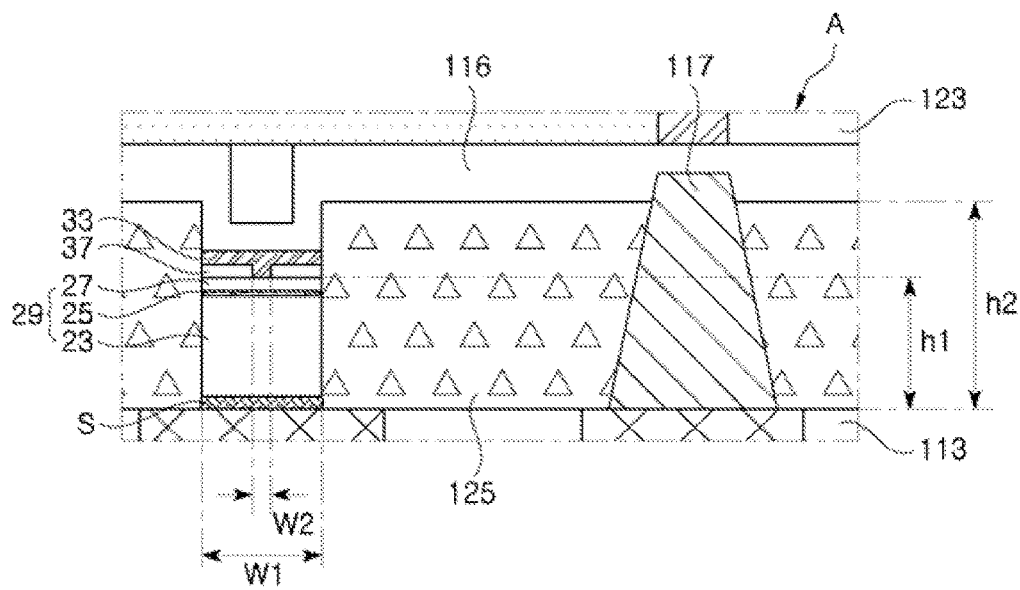
FIG. 15 is an enlarged view of part A of FIG. 14.

FIG. 14 is a cross-sectional view of a display apparatus according to an exemplary embodiment, and FIG. 15 is an enlarged view of part A of FIG. 14.

Referring to FIG. 14, the display apparatus 100 according to the present exemplary embodiment includes a light emitting diode part 110, a TFT panel part 130, and an anisotropic conductive film 150. The light emitting diode part 110 includes a light emitting part 111 and a light conversion part 123.

The light emitting part 111 includes light emitting diodes 112, a connection substrate 113, a transparent electrode 116, reflective electrodes 117, and an encapsulation layer 125. The light emitting diodes 112 are provided in plural and regularly arranged with reference to the connection substrate 113. For example, the plurality of light emitting diodes 112 may be arranged at constant intervals in rows and columns. In the present exemplary embodiment, blue or UV light emitting diodes are used as the light emitting diodes 112. In addition, the light emitting diodes 112 may be green or red light emitting diodes. In this manner, since different kinds of light emitting diodes 112 are disposed on the connection substrate 113, the light conversion part 123 may be changed.

The display apparatus 100 according to the present exemplary embodiment may be driven when power is applied from an exterior power source to each of the light emitting diodes 112 of the light emitting diode part 110. That is, each of the light emitting diodes 112 can be turned-on or tuned-off in combination, and light emitted from the light emitting diodes 112 is converted into red light, green light, and blue light while passing through the light conversion part 123. Accordingly, the light emitting diode part 110 of the display apparatus 100 may be driven without a separate LCD. Alternatively, when the plurality of light emitting diodes 112 includes blue, green, and red light emitting diodes, the light conversion part 123 may be omitted.

In the present exemplary embodiment, a region including a single light emitting diode 112 may be used as a subpixel in the display apparatus 100, and one pixel may include three or four subpixels. In the light emitting diode part 110, one subpixel may have a larger size than the light emitting diode 112 disposed in the subpixel.

Referring to FIG. 14, each of the light emitting diodes 112 may include an n-type semiconductor layer 23, an active layer 25, a p-type semiconductor layer 27, a p-type electrode 33, and an insulating layer 37. Here, a light emitting structure 29 including the n-type semiconductor layer 23, the active layer 25, and the p-type semiconductor layer 27 may include Group III-V based compound semiconductors.

For example, the n-type semiconductor layer 23, the active layer 25, and the p-type semiconductor layer 27 may include nitride semiconductors such as (Al, Ga, In)N. According to exemplary embodiments, locations of the n-type semiconductor layer 23 and the p-type semiconductor layer 27 may be interchanged.

The n-type semiconductor layer 23 may include an n-type dopant (for example, Si) and the p-type semiconductor layer 27 may include a p-type dopant (for example, Mg). The active layer 25 is interposed between the n-type semiconductor layer 23 and the p-type semiconductor layer 27 and may have a multi-quantum well (MQW) structure, and the composition of the active layer 25 may be determined so as to emit light having a desired peak wavelength.

In the present exemplary embodiment, the light emitting structure 29 including the n-type semiconductor layer 23, the active layer 25, and the p-type semiconductor layer 27 may have a shape of a vertical type light emitting diode. Further, an n-type electrode (not shown) may be formed on an outer surface of the n-type semiconductor layer 23, the p-type electrode 33 may be formed on an outer surface of the p-type semiconductor layer 27, and the n-type electrode and the p-type electrode 33 may be omitted, as needed. In the present exemplary embodiment, the n-type electrode is omitted.

Further, the p-type electrode 33 may include a transparent material. Although the p-type electrode 33 is disposed to cover the entire p-type semiconductor layer 27, an electrical contact area between the p-type electrode 33 and the p-type semiconductor layer 27 may be smaller than the area of the p-type electrode 33. As shown in FIG. 14, the insulating layer 37 may be formed between the p-type electrode 33 and the p-type semiconductor layer 27, and may be disposed to expose a portion of the p-type semiconductor layer 27 while covering the entire remaining part of the p-type semiconductor layer 27. With this structure, the p-type electrode 33 may electrically contact the exposed portion of the p-type semiconductor layer 27 through the insulating layer 37.

As described above, when the electrical contact area between the p-type electrode 33 and the p-type semiconductor layer 27 is smaller than the area of an upper surface of the p-type semiconductor layer 27, current density may be relatively increased even when small electric current is supplied through the p-type electrode 33. In the present exemplary embodiment, the location at which the p-type semiconductor layer 27 is exposed through the insulating layer 37 may be the center of the upper surface of the p-type semiconductor layer 27.

Referring to FIG. 15, the total width W1 of the p-type semiconductor layer 27 of the light emitting structure 29 may be greater than the width W2 of the region of the p-type semiconductor layer 27 exposed through the insulating layer 37 (W2<W1). For example, when the total width W1 of the p-type semiconductor layer 27 is 10 μm or less, the region of the p-type semiconductor layer 27 exposed through the insulating layer 37 may have a width W2 of 1 μm or less.

Hereinafter, a relationship between the width of the region of the p-type semiconductor layer 27 exposed through the insulating layer 37 and the total width of the p-type semiconductor layer 27 will be described below.

In the present exemplary embodiment, both the p-type electrode 33 and the insulating layer 37 may include transparent materials. The p-type electrode 33 may be formed of a transparent material, such as ITO, and the insulating layer 37 may be formed of a transparent insulating material, such as $SiN_x$. Although the p-type electrode 33 and the insulating layer 37 may be transparent with respect to light of any wavelength bands, the p-type electrode 33 and the insulating layer 37 may include any material being transparent at light having a peak wavelength in the range of 360 nm to 470 nm, when the light emitting diodes 112 according to the present exemplary embodiment are blue or UV light emitting diodes 112.

The connection substrate 113 may support the light emitting part 111, and may be selected from any kind of substrate. In the present exemplary embodiment, the connection substrate 113 may be an insulating substrate that exhibits conductivity at some parts thereof. That is, although most of the connection substrate 113 exhibits insulating properties, some portions of the connection substrate 113 adjoining the light emitting diodes 112 and the reflective electrodes 117 may exhibit conductivity. To this end, the connection substrate 113 may include conductive portions 113a and insulating portions 113b. In addition, the conductive portions 113a are formed from an upper surface of the connection substrate 113 to a lower surface thereof through the connection substrate 113 to allow electrical connection between the upper and lower surfaces of the connection substrate 113.

The connection substrate 113 may be prepared by forming a plurality of holes through an electrically insulating substrate, such that the holes are formed through the substrate, followed by filling the holes with a conductive material (for example, Cu). As a result, the connection substrate 113 includes a plurality of conductive portions 113a, which are electrically insulated from one another by the insulating portions 113b.

The connection substrate 113 may be flexible. As a result, the connection substrate 113 may be coupled to a planar TFT panel part 130 or a curved TFT panel part 130. In the present exemplary embodiment, the insulating portions 113b of the connection substrate 113 may include polydimethylpolysiloxane (PDMS), polyimide, ceramic, or a mixture thereof. The conductive portions 113a may include metal having high electrical conductivity (for example, copper (Cu), gold (Au), or silver (Ag)).

After the connection substrate 113 is formed, the light emitting diodes 112 are disposed on the conductive portions 113a of the connection substrate 113. In the present exemplary embodiment, the n-type semiconductor layer 23 of each of the light emitting diodes 112 may be disposed on the conductive portion 113a of the connection substrate 113 by a bonding agent S.

As described above, in the connection substrate 113, the conductive portions 113a exhibit electrical conductivity and the insulating portions 113b exhibit electrical insulating properties. Both the conductive portions 113a and the insulating portions 113b may include a material capable of reflecting light emitted from the light emitting diodes 112. Accordingly, light emitted from the light emitting diodes 112 may be reflected by the connection substrate 113 towards the reflective electrodes 117 or in an upward direction.

The transparent electrode 116 may electrically contact the p-type electrodes 33 of the light emitting diodes 112, and may also electrically contact the reflective electrodes 117. With this structure, power supplied from the reflective electrodes 117 may be supplied to a p type side. In the present exemplary embodiment, the transparent electrode 116 may allow light emitted from the light emitting diodes 112 to be directed to the light conversion part 123 therethrough, and may be formed to be as thin as possible. In the present exemplary embodiment, the transparent electrode 116 may include ITO.

Each of the reflective electrodes 117 may have a predetermined thickness, and is disposed to surround the light emitting diode 112. The reflective electrode 117 is disposed to surround the side surface of the light emitting diode 112, and may be separated from the light emitting diode 112 by a predetermined distance. Thus, the size of one subpixel may be determined by the reflective electrode 117.

In the present exemplary embodiment, the reflective electrode 117 may have an inclined side surface facing the light emitting diode 112, as shown in FIG. 14. Here, the inclined surface of the reflective electrode 117 may be sloped to reflect light emitted from the light emitting diode 112 towards the transparent electrode 116.

Further, the reflective electrode 117 may have a sidewall, which may define a region for one subpixel and integrated with a sidewall of adjacent subpixel. That is, the reflective electrodes 117 may be disposed such that upper portions of the reflective electrodes 117 divide the transparent electrode 116 into a plurality of regions while adjoining the transparent electrode 116, and lower portions of the reflective electrodes 117 may electrically contact the conductive portions of the connection substrate 113.

Each of the regions divided by the reflective electrodes 117 may function as a subpixel in the display apparatus 100, and each subpixel may include at least one light emitting diode 112.

The encapsulation layer 125 may fill in the subpixel regions defined by the reflective electrodes 117. In the present exemplary embodiment, the encapsulation layer 125 fills spaces between the side surfaces of the light emitting diodes 112 and the inclined surfaces of the reflective electrodes 117, and may have a height greater than a height of the light emitting diodes 112. The encapsulation layer 125 may be disposed so as not to cover upper surfaces of the light emitting diodes 112. That is, the encapsulation layer 125 may surround only the side surfaces of the light emitting diodes 112 while exposing the upper surfaces of the light emitting diodes 112. As such, grooves may be formed on the upper surfaces of the light emitting diodes 112, and the encapsulation layer 125 fills the spaces between the light emitting diodes 112 and the reflective electrodes 117. The encapsulation layer 125 may include a transparent material that exhibits electrical insulating properties. Thus, light emitted from the light emitting diodes 112 may be discharged through the encapsulation layer 125.

Referring to FIG. 15, the following description will focus on the height h2 of the encapsulation layer 125 filling spaces between the reflective electrodes 117. The height h2 of the encapsulation layer 125 refers to a height from the upper surface of the connection substrate 113. Further, the height h1 of the light emitting diodes 112 refers to a height from the upper surface of the connection substrate 113. The height h2 of the encapsulation layer 125 is greater than the height h1 of the light emitting diodes 112, and is less than the height of the reflective electrodes 117. Since the encapsulation layer 125 fills the spaces between the reflective electrodes 117, the height h2 of the encapsulation layer 125 is less than the height of the reflective electrodes 117.

In addition, as described above, the height h2 of the encapsulation layer 125 is greater than the height h1 of light emitting diodes 112. In the present exemplary embodiment, since the height h2 of the encapsulation layer 125 is greater than the height h1 of the light emitting diodes 112, and the encapsulation layer 125 is not disposed on the light emitting diodes 112, the p-type electrodes 33 of the light emitting diodes 112 electrically contact the transparent electrode 116, even when the locations of the light emitting diodes 112 are changed during the manufacturing process.

That is, the transparent electrode 116 is disposed to cover the encapsulation layer 125 and the reflective electrodes 117, in addition to the upper surfaces of the light emitting diodes 112. Further, since the upper sides of the light emitting diodes 112 are open, instead of being covered by the encapsulation layer 125, the transparent electrode 116 may be electrically connected to the p-type electrodes 33 of the light emitting diodes 112, regardless of the locations of the light emitting diodes 112.

The light conversion part 123 includes a phosphor layer 126, a color filter 127, and a protective substrate 128. Although the light conversion part 123 includes the phosphor layer 126, the color filter 127, and the protective substrate 128, the light conversion part 123 may be omitted, as needed. The light conversion part 123 may include one of the phosphor layer 126 and the color filter 127. That is, when blue or UV light emitting diodes are used as the light emitting diodes 112, the light conversion part 123 may include at least one of the phosphor layer 126 and the color filter 127. In addition, when the light emitting diodes 112 include blue light emitting diodes, green light emitting diodes, and red light emitting diodes, the light conversion part 123 may be omitted.

The phosphor layer 126 may be disposed on the protective substrate 128, and may include a green phosphor layer 126b, a red phosphor layer 126c, and a transparent layer 126e. The green phosphor layer 126b, the red phosphor layer 126c, and the transparent layer 126e are alternately arranged to be adjacent each other, and are separated from each other by a predetermined distance or more. In addition, a blocking layer 126d may be disposed between the green phosphor layer 126b, the red phosphor layer 126c, and the transparent layer 126e. Accordingly, the blocking layer 126d may prevent mixture of light by blocking light having entered the green phosphor layer 126b, the red phosphor layer 126c, or the transparent layer 126e from entering other phosphor layers.

Although the blue light emitting diodes are illustrated as the light emitting diodes 112, the light emitting diodes 112 may emit light having a peak wavelength (for example, 360 nm to 470 nm) in the blue light range or near UV range.

Accordingly, the green phosphor layer 126b emits green light through wavelength conversion of blue light emitted from the light emitting diodes 112, and the red phosphor layer 126c emits red light through wavelength conversion of blue light emitted from the light emitting diodes 112. The transparent layer 126e allows blue light emitted from blue light emitting diode to be discharged therethrough without wavelength conversion.

When the light emitting diodes 112 are UV light emitting diodes, a blue phosphor layer 126a may be disposed at the location of the transparent layer 126e, instead of the transparent layer 126e. In this structure, UV light emitted from the light emitting diodes 112 is converted into blue light while passing through the blue phosphor layer 126a such that blue light may be discharged outside.

In the present exemplary embodiment, the color filter 127 may be interposed between the phosphor layer 126 and the protective substrate 128. The color filter 127 may include a blue light portion 127a, a green light portion 127b, a red light portion 127c, and a light blocking portion 127d. The color filter 127 may be formed in a film shape, and may block light having passed through the color filter 127 excluding light of a predetermined wavelength.

That is, the blue light portion 127a allows only blue light to pass therethrough by blocking light having wavelengths other than the wavelength of blue light, and the green light portion 127b allows only green light to pass therethrough by blocking light having wavelengths other than the wavelength of green light. The red light portion 127c allows only red light to pass therethrough by blocking light having wavelengths other than the wavelength of red light. The light blocking portion 127d is disposed between the blue light portion 127a, the green light portion 127b, and the red light portion 127c, and blocks all fractions of light.

The blue light portion 127a of the color filter 127 is disposed on the transparent layer 126e of the phosphor layer 126, and the green light portion 127b of the color filter 127 is disposed on the green phosphor layer 126b of the phosphor layer 126. In addition, the red light portion 127c of the color filter 127 is disposed on the red phosphor layer 126c of the phosphor layer 126. Accordingly, light emitted from the light emitting diodes 112 is subjected to wavelength conversion while passing through the phosphor layer 126, whereby blue light, green light, and red light may be separately discharged outside through the color filter 127. For example, although blue light emitted from the light emitting diodes 112 is converted into green light through the green phosphor layer 126b, some fraction of blue light may pass through the phosphor layer 126 without wavelength conversion. Blue light having passed through the phosphor layer 126 without wavelength conversion is blocked by the green light portion 127b of the color filter 127, such that only green light may be discharged through the green light portion 127b of the color filter 127.

The protective substrate 128 is disposed to contact the color filter 127, and protect the color filter 127 from the outside by preventing the color filter 127 from being directly exposed. In the present exemplary embodiment, the protective substrate 128 may include a transparent material, through which light may pass.

The TFT panel part 130 is coupled to the light emitting part 111, and may supply power to the light emitting part 111. To this end, the TFT panel part 130 includes a panel substrate 132 and second connection electrodes 134. The TFT panel part 130 may control power supply to the light emitting diode part 110, such that only a portion of the light emitting diodes 112 in the light emitting diode part 110 emit light, and may control the intensity of light emitted from the light emitting diodes 112.

The panel substrate 132 may have a TFT drive circuit. The TFT drive circuit may be a circuit for driving an active matrix (AM) or a circuit for driving a passive matrix (PM).

The second connection electrodes 134 are electrically connected to the TFT drive circuit of the panel substrate 132, and to the light emitting diodes 112 or the reflective electrodes 117 of the light emitting diode part 110. That is, the second connection electrodes 134 may be provided in plural and may be separated from each other. Power supplied through the TFT drive circuit may be supplied to each of the light emitting diodes 112 through the second connection electrodes 134 and the reflective electrodes 117. In the present exemplary embodiment, the second connection electrodes 134 may be covered by a separate protective layer (not shown), which may include, for example, $SiN_x$.

The anisotropic conductive film 150 may electrically connect the light emitting diode part 110 to the TFT panel part 130. The anisotropic conductive film 150 may include an adhesive organic insulating material and conductive particles uniformly dispersed therein to achieve electrical connection. The anisotropic conductive film 150 exhibits conductivity in the thickness direction (vertical direction) and insulating properties in the plane direction (horizontal direction). In addition, the anisotropic conductive film 150 exhibits adhesive properties. With this structure, the anisotropic conductive film 150 may bond the light emitting part 111 to the TFT panel part 130, such that the light emitting part 111 may be electrically connected to the TFT panel part 130 therethrough.

Particularly, the anisotropic conductive film 150 may be advantageously used to connect ITO electrodes, which are known to be difficult to solder at high temperature.

As such, when the light emitting part 111 is coupled to the TFT panel part 130 via the anisotropic conductive film 150, the connection substrate 113 may be electrically connected to the second connection electrodes 134 of the TFT panel part 130 via an electrode connection portion 152.

FIGS. 16A to 16G are sectional views illustrating a process of manufacturing the light emitting diodes of the display apparatus of FIG. 14.

Hereinafter, the process of manufacturing the plurality of light emitting diodes 112 will be described with reference to FIGS. 16A to 16G.

Figure 16A:
FIG. 16A, FIG. 16B, FIG. 16C, FIG. 16D, FIG. 16E, FIG. 16F, and FIG. 16G are cross-sectional views illustrating a process of manufacturing light emitting diodes of the display apparatus of FIG. 14.

First, referring to FIG. 16A, a light emitting structure 29, which includes sequentially stacked n-type semiconductor layer 23, active layer 25, and p-type semiconductor layer 27, is disposed on a first manufacturing substrate 21*a*. The n-type semiconductor layer 23 may include an n-type electrode (not shown) formed on a lower side thereof, as needed. The first manufacturing substrate 21*a* may be a sapphire substrate, a gallium nitride substrate, a glass substrate, a silicon carbide substrate, a silicon substrate, a metal substrate, a ceramic substrate, or the like.

Figure 16B:

Referring to FIG. 16B, an insulating layer 37, p-type electrodes 33, and inserts 34 may be sequentially formed on the p-type semiconductor layer 27. The insulating layer 37 may be formed to have a predetermined thickness on the p-type semiconductor layer 27, and may be etched to form holes at locations to which light emitting diodes 112 will be formed, such that the p-type semiconductor layer 27 may be exposed through the holes. Then, the p-type electrode 33 is formed on the insulating layer 37 to cover the entire insulating layer 37 while filling the holes formed in the insulating layer 37. As a result, the p-type electrode 33 may be electrically connected to the p-type semiconductor layer 27 through the holes.

After formation of the p-type electrode 33, the insert 34 is formed to have a predetermined thickness or more on each p-type electrode 33. The insert 34 may exhibit electrical insulating properties, but is not limited thereto. In the present exemplary embodiment, the insert 34 is formed of SiO$_2$. The insert 34 may have a predetermined thickness or more, and may be thicker than the p-type electrode 33 formed under the insert 34.

Figure 16C:
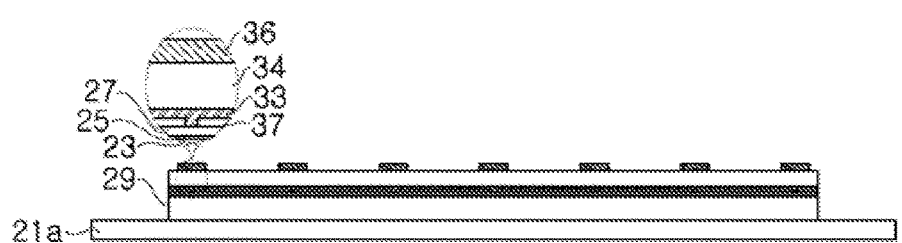

Referring to FIG. 16C, a mask 36 is formed on the insert 34. The mask 36 may have a predetermined width, and may be disposed on each of the holes formed in the insulating layer 37. That is, the locations of the holes formed in the insulating layer 37 correspond to the light emitting diodes 112 to be formed, and the mask 36 may be formed at the location of the light emitting diodes 112 to be formed. The mask 36 may include metal.

Figure 16D:
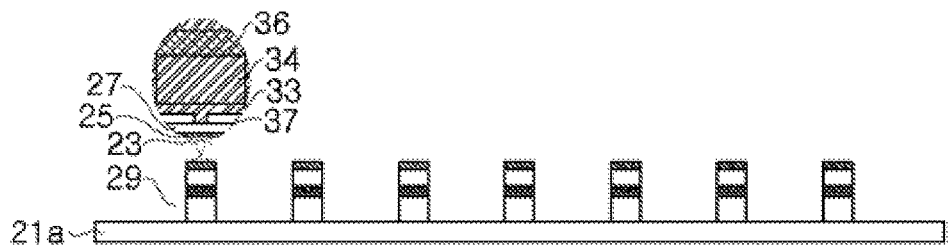

With the masks 36 disposed on the inserts 34, the p-type electrodes 33, the insulating layer 37, the p-type semiconductor layer 27, the active layer 25, and the n-type semiconductor layer 23 are etched with reference to the masks 36. As a result, a plurality of light emitting diodes 112 may be formed on the first manufacturing substrate 21*a*, as shown in FIG. 16D. Although the light emitting diodes 112 are illustrated as being disposed perpendicular to the first manufacturing substrate 21*a*, the light emitting diodes 112 may be formed to have inclined side surfaces.

Figure 16E:
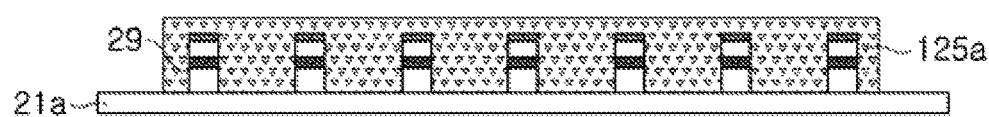
Figure 16F:
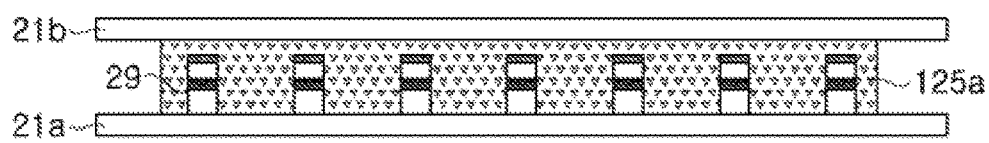
Figure 16G:
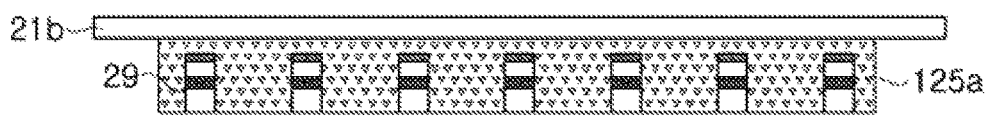

In order to transfer the plurality of light emitting diodes 112 to the connection substrate 113, a filler 125*a* is applied to the light emitting diodes 112 so as to cover all of the light emitting diodes 112, as shown in FIG. 16E. Then, as shown in FIG. 16F, a second manufacturing substrate 21*b* is bonded to an upper side of the filler 125*a*. The second manufacturing substrate 21*b* may be the same kind of substrate as the first manufacturing substrate 21*a*, or may be a different kind of substrate than the first manufacturing substrate 21*a*, as needed. After the second manufacturing substrate 21*b* is coupled to the upper side of the filler 125*a*, the first manufacturing substrate 21*a* is removed, as shown in FIG. 16G.

FIGS. 17A to 17G are cross-sectional views illustrating a process of manufacturing the light emitting part of the display apparatus of FIG. 14.

The light emitting part 111 (see FIG. 14) may be manufactured using the plurality of light emitting diodes 112 manufactured by the process shown in FIGS. 16A to 16G, and the process of manufacturing the light emitting part 111 will be described with reference to FIGS. 17A to 17G.

Figure 17A:
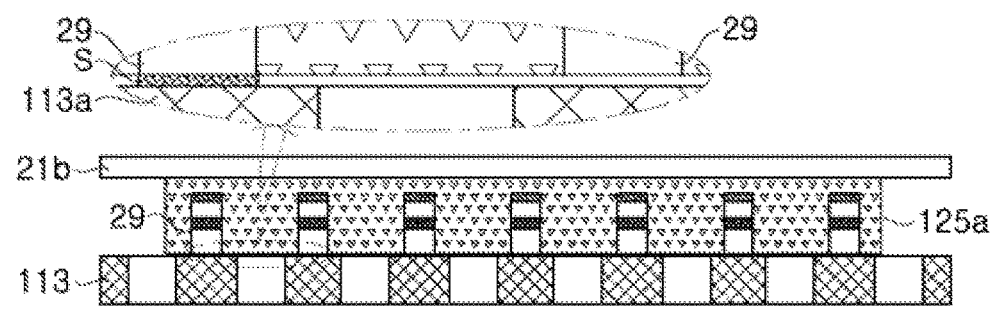
FIG. 17A, FIG. 17B, FIG. 17C, FIG. 17D, FIG. 17E, FIG. 17F, and FIG. 17G are cross-sectional views illustrating a process of manufacturing a light emitting part of the display apparatus of FIG. 14.

Referring to FIG. 17A, the connection substrate 113 is brought into contact with the plurality of light emitting diodes 112 attached to the second manufacturing substrate 21*b*. A bonding agent S is deposited to a portion of an upper surface of the connection substrate 113. The bonding agent S may be deposited only to the conductive portions 113*a* of the connection substrate 113, specifically, only to some conductive portions 113*a* rather than to all of the conductive portions 113*a*. Some conductive portions 113*a* of the connection substrate 113 are electrically connected to the light emitting diodes 112, and the other conductive portions 113*a* are electrically connected to the reflective electrodes 117, as will be described below. Thus, in order to couple the light emitting diodes 112 to the connection substrate 113, the bonding agent S is applied only to the conductive portions 113*a* of the connection substrate 113, to which the light emitting diodes 112 are to be coupled. In the present exemplary embodiment, the bonding agent S may include at least one of In, Sn, AgSn and AuSn.

Figure 17B:
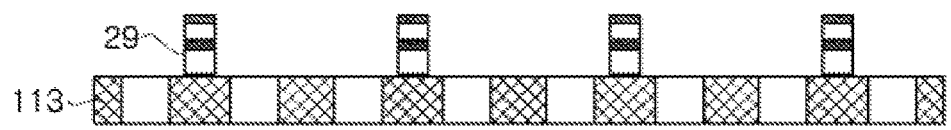

Among the plurality of light emitting diodes 112 bonded to the second manufacturing substrate 21*b*, only the light emitting diodes 112 contacting the bonding agent S applied to the conductive portions 113*a* of the connection substrate 113 are coupled to the connection substrate 113. When the second manufacturing substrate 21*b* is separated from the connection substrate 113 with some of the light emitting diodes 112 are coupled to the connection substrate 113, the plurality of light emitting diodes 112 may be coupled to the connection substrate 113 so as to be arranged at constant intervals, as shown in FIG. 17B. In the present exemplary embodiment, one light emitting diode 112 is provided to one subpixel. Alternatively, two or more light emitting diodes 112 may also be provided to one subpixel, as needed.

Figure 17C:

After the plurality of light emitting diodes 112 is coupled to the connection substrate 113 through the aforementioned process, an encapsulation layer 125 may be formed to cover all of the light emitting diodes 112 and the connection substrate 113, as shown in FIG. 17C. The encapsulation layer 125 may include a transparent and electrically insulating material.

Figure 17D:
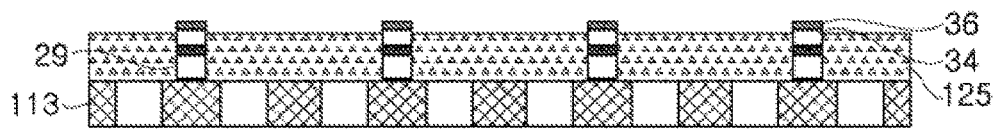

Then, referring FIG. 17D, the encapsulation layer 125 is etched to expose the masks 36 and part of the inserts 34.

Etching of the encapsulation layer 125 may be performed, such that part of the insert 34 protrudes above the encapsulation layer 125.

Figure 17E:
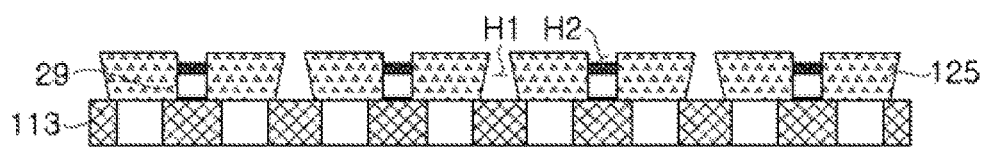

Then, referring to FIG. 17E, first holes H1 are formed by etching the encapsulation layer 125 disposed between the light emitting diodes 112 with reference to the exposed inserts 34. The first holes H1 may be formed to be perpendicular to the upper surface of the connection substrate 113, or may be formed to have an inclined surface. By formation of the first holes H1, the shape of the subpixels on the connection substrate 113 may be determined.

Second holes H2 may be formed on the light emitting diodes 112 simultaneously with, or subsequent to formation of the first holes H1. The second holes H2 are formed on the light emitting diodes 112 by removing the masks 36 and the inserts 34 disposed on the light emitting diodes 112. The masks 36 are removed by removing the inserts 34 through etching. For example, the inserts 34 including $SiO_2$ may be removed by etching with HF to form the second holes H2. As a result, the encapsulation layer 125 and the p-type electrodes 33 are not removed, and only the inserts 34 are removed by etching, whereby the second holes H2 may be formed on the light emitting diodes 112. In this manner, as the second holes H2 are formed by removing the inserts 34 on the light emitting diodes 112, the p-type electrodes 33 may be exposed through the second holes H2.

Figure 17F:
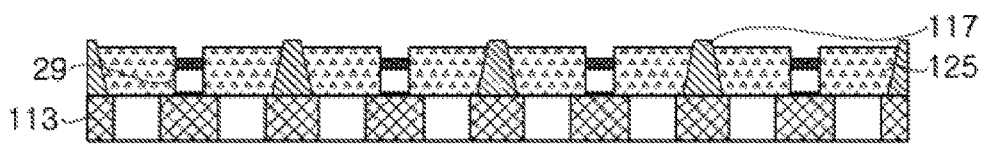

After the first holes H1 and the second holes H2 are formed as described above, reflective electrodes 117 are formed to fill the first holes H1, as shown in FIG. 17F. The reflective electrodes 117 are formed to have a shape corresponding to the shape of the first holes H1, and protrude above the first holes H1. As a result, the reflective electrodes 117 may protrude above the upper surface of the encapsulation layer 125. In addition, since the reflective electrodes 117 are formed to have the shape corresponding to the shape of the first holes H1, the reflective electrodes 117 may have an inclined side surface.

Figure 17G:
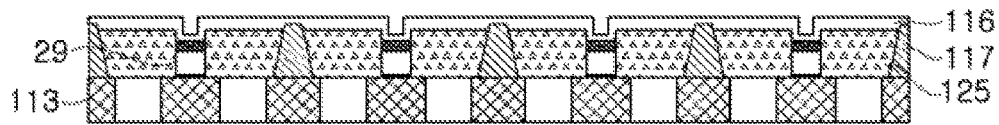

After formation of the reflective electrodes 117, a transparent electrode 116 is formed to cover the p-type electrodes 33, the encapsulation layer 125, and the reflective electrodes 117, as shown in FIG. 17G. The transparent electrode 116 fills the second holes H2 and may fill all steps formed between the encapsulation layer 125 and the reflective electrodes 117. Accordingly, the transparent electrode 116 may be electrically connected to each of the p-type electrodes 33 and the reflective electrodes 117.

After forming the light emitting part 111 is completed, the TFT panel part 130 may be coupled to a lower side of the connection substrate 113 through the anisotropic conductive film 150. The TFT panel part 130 may have a large area and a plurality of light emitting parts 111 may be coupled to one TFT panel part 130.

The light conversion part 123 that may convert the wavelength of light emitted from the light emitting part 111, or to allow light emitted therefrom and having a predetermined wavelength to be discharged outside therethrough, may be coupled to an upper side of the transparent electrode 116. Like the TFT panel part 130, the light conversion part 123 may also have a large area, such that the plurality of light emitting part 111 may be coupled to one light conversion part 123.

Figure 18:
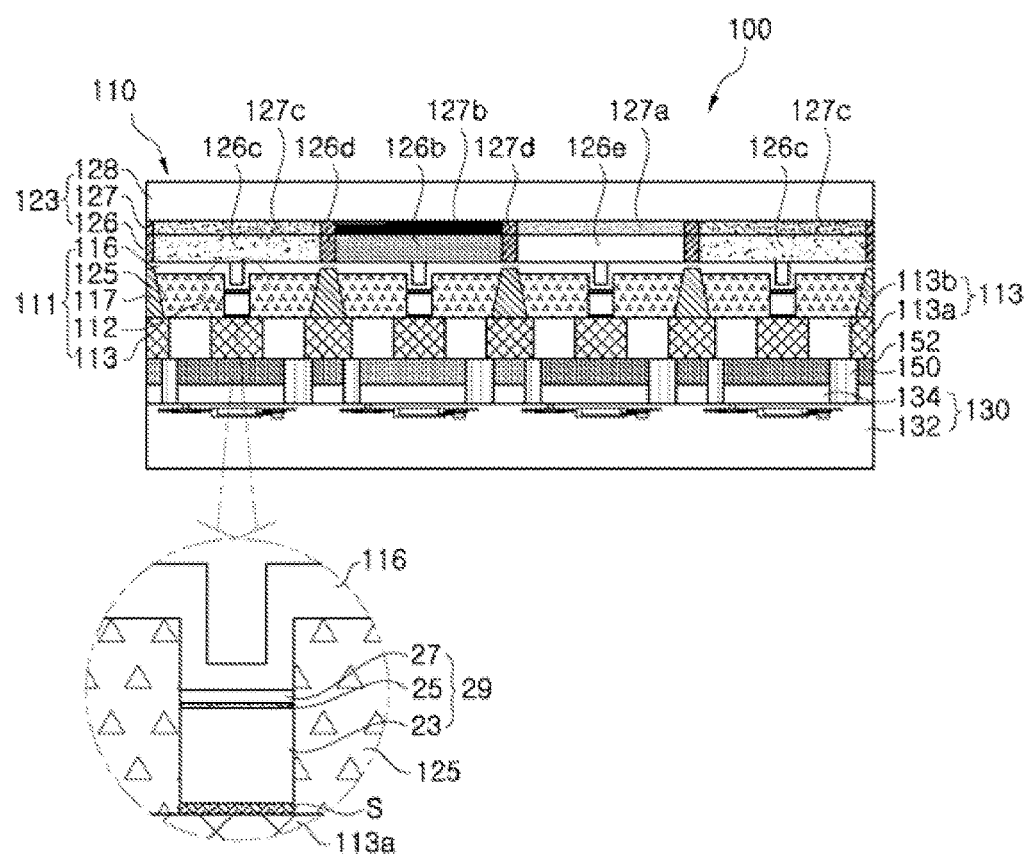
FIG. 18 is a cross-sectional view of a display apparatus according to an exemplary embodiment.

FIG. 18 is a cross-sectional view of a display apparatus according to an exemplary embodiment.

Referring to FIG. 18, the display apparatus 100 according to the present exemplary embodiment includes a light emitting diode part 110, a TFT panel part 130, and an anisotropic conductive film 150. The light emitting diode part 110 includes a light emitting part 111 and a light conversion part 123.

The light emitting part 111 includes light emitting diodes 112, a connection substrate 113, a transparent electrode 116, reflective electrodes 117 and an encapsulation layer 125; and the light conversion part 123 includes a phosphor layer 126, a color filter 127 and a protective substrate 128.

In the present exemplary embodiment, referring to FIG. 18, the light emitting diodes 112 include an n-type semiconductor layer 23, an active layer 25, and a p-type semiconductor layer 27. That is, the light emitting diodes 112 do not include the insulating layer 37 and the p-type electrode 33, unlike the light emitting diodes of FIG. 14. In this structure, the p-type semiconductor layer 27 of the light emitting diodes 112 may directly adjoin the transparent electrode 116. Thus, power may be supplied to the entire p-type semiconductor layer 27 through the transparent electrode 116.

As such, the light emitting diodes 112 according to the exemplary embodiments are formed to directly contact the connection substrate 113 and the transparent electrode 116, thereby reducing the number of processes in manufacture of the display apparatus. Further, there may be no failure in a process of electrically connecting the transparent electrode 116 to the p-type semiconductor layer 27, although the light emitting diodes 112 are not disposed at accurate locations on the connection substrate 113.

Although some exemplary embodiments have been described herein, it should be understood by those skilled in the art that these embodiments are given by way of illustration only, and that various modifications, variations, and alterations can be made without departing from the spirit and scope of the invention. Therefore, the scope of the present disclosure should be limited only by the accompanying claims and equivalents thereof.

What is claimed is:

1. A display apparatus comprising:
a light emitting diode part comprising a plurality of regularly arranged light emitting diodes; and
a thin-film transistor (TFT) panel part configured to drive the light emitting diode part,
wherein the light emitting diode part comprises:
a transparent electrode;
the light emitting diodes regularly disposed on a first surface of the transparent electrode and electrically connected to the transparent electrode;
a plurality of first reflective electrodes disposed at sides of the light emitting diodes, surrounding the light emitting diodes, and electrically connected to the transparent electrode; and
a plurality of second reflective electrodes electrically connected to the light emitting diodes, respectively, and reflecting light emitted from the light emitting diodes.

2. The display apparatus according to claim 1, wherein:
each of the plurality of light emitting diodes comprises:
a light emitting structure comprising a first conductivity type semiconductor layer, a second conductivity type semiconductor layer, and an active layer interposed between the first and second conductivity type semiconductor layers;
a first electrode disposed to cover the first conductivity type semiconductor layer and electrically connected to the first conductivity type semiconductor layer; and a second electrode disposed to cover the second conductivity type semiconductor layer and electrically connected to the second conductivity type semiconductor layer;

each of the light emitting diodes further comprise an insulating layer interposed between the second conductivity type semiconductor layer and the second electrode, the insulating layer formed with a through-hole through which the second conductivity type semiconductor layer is exposed to be electrically connected to the second conductivity type semiconductor; and the second reflective electrodes is electrically connected to the second electrode.

3. The display apparatus according to claim 1, wherein the light emitting diode part further comprises a color filter disposed on a second surface of the transparent electrode opposing the first surface, the color filter blocking light emitted from the light emitting diodes having a predetermined wavelength.

4. The display apparatus according to claim 3, wherein the color filter comprises:
   a green light portion configured to pass only green light therethrough among light emitted from the light emitting diodes;
   a red light portion configured to pass only red light therethrough among light emitted from the light emitting diodes; and
   a blue light portion configured to pass only blue light therethrough among light emitted from the light emitting diodes.

5. The display apparatus according to claim 4, wherein the light emitting diode part further comprises a phosphor layer interposed between the transparent electrode and the color filter, and emitting white light through wavelength conversion of light emitted from the light emitting diodes.

6. The display apparatus according to claim 4, wherein the light emitting diode part further comprises a phosphor layer disposed to fill spaces between the light emitting diodes and the first reflective electrodes, and emitting white light through wavelength conversion of light emitted from the light emitting diodes.

7. The display apparatus according to claim 1, wherein the light emitting diode part further comprises a phosphor layer disposed on a second surface of the transparent electrode opposing the first surface, the phosphor layer converting wavelengths of light emitted from the light emitting diodes.

8. The display apparatus according to claim 1, wherein the light emitting diode part further comprises a phosphor layer disposed to fill spaces between the light emitting diodes and the first reflective electrodes.

9. The display apparatus according to claim 7, wherein:
   the light emitting diodes are blue light emitting diodes; and
   the phosphor layer comprises:
      a green phosphor layer emitting green light through wavelength conversion of blue light emitted from the blue light emitting diodes;
      a red phosphor layer emitting red light through wavelength conversion of blue light emitted from the blue light emitting diodes; and
      a transparent layer allowing light emitted from the blue light emitting diodes to pass therethrough without wavelength conversion.

10. The display apparatus according to claim 7, wherein:
    the light emitting diodes are ultraviolet (UV) light emitting diodes; and
    the phosphor layer comprises:
       a blue phosphor layer emitting blue light through wavelength conversion of UV light emitted from the UV light emitting diodes;
       a green phosphor layer emitting green light through wavelength conversion of UV light emitted from the UV light emitting diodes; and
       a red phosphor layer emitting red light through wavelength conversion of UV light emitted from the UV light emitting diodes.

11. The display apparatus according to claim 7, wherein the phosphor layer emits white light through wavelength conversion of light emitted from the light emitting diodes.

12. The display apparatus according to claim 3, wherein the light emitting diode part further comprises a support substrate disposed on a first surface of the color filter with the transparent electrode adjoining a second surface of the color filter.

13. The display apparatus according to claim 7, wherein the light emitting diode part further comprises a support substrate disposed on a first surface of the phosphor layer with the transparent electrode adjoining a second surface of the phosphor layer.

14. The display apparatus according to claim 1, further comprising an anisotropic conductive film electrically connecting the light emitting diode part to the TFT panel part.

15. A display apparatus comprising:
    a light emitting part comprising a plurality of regularly arranged light emitting diodes; and
    a thin-film transistor (TFT) panel part comprising a plurality of TFTs configured to drive the light emitting diodes,
    wherein the light emitting part comprises:
       a substrate;
       the light emitting diodes disposed on the substrate;
       an encapsulation layer surrounding the light emitting diodes and comprising grooves exposing upper surfaces of the light emitting diodes;
       a transparent electrode disposed on the light emitting diodes and electrically connected to the light emitting diodes through the grooves; and
       a plurality of reflective electrodes disposed on the substrate and surrounding the light emitting diodes so as to be separated from side surfaces of the light emitting diodes.

16. The display apparatus according to claim 15, wherein the transparent electrode is disposed to cover the light emitting diodes, the encapsulation layer, and the reflective electrodes.

17. The display apparatus according to claim 15, wherein:
    each of the light emitting diodes comprises a light emitting structure comprising:
       a first conductivity type semiconductor layer;
       a second conductivity type semiconductor layer; and
       an active layer interposed between the first and second conductivity type semiconductor layers; and
    the transparent electrode is electrically connected to the second conductivity type semiconductor layer.

18. The display apparatus according to claim 15, wherein:
    each of the plurality of light emitting diodes comprises:
       a light emitting structure comprising a first conductivity type semiconductor layer, a second conductivity type semiconductor layer, and an active layer interposed between the first and second conductivity type semiconductor layers;
       an electrode disposed to cover and electrically connected to the second conductivity type semiconductor; and an insulating layer interposed between the second conductivity type semiconductor layer and the electrode, the insulating layer comprising a through-hole exposing part of the second conductivity type semiconductor layer; and the electrode is electrically connected to the second conductivity type semiconductor layer through the through-hole.

19. The display apparatus according to claim 18, wherein the through-hole has a width less than a width of an upper surface of the second conductivity type semiconductor layer.

20. The display apparatus according to claim 18, wherein the electrode and the insulating layer are transparent.

21. The display apparatus according to claim 15, wherein a height from an upper surface of the substrate to an upper surface of the encapsulation layer is greater than a height from the upper surface of the substrate to upper surfaces of the light emitting diodes.

22. The display apparatus according to claim 15, wherein:
the substrate comprises a plurality of conductive portions and a plurality of insulating portions;
the light emitting diodes are electrically connected to a portion of the conductive portions;
the TFTs are electrically connected to the light emitting diodes through the conductive portions; and
the reflective electrodes is electrically connected to the remaining portion of the conductive portions.

23. The display apparatus according to claim 15, further comprising a light conversion portion converting light emitted from the light emitting part,
wherein the light conversion portion is coupled to one side of the light emitting part.

24. The display apparatus according to claim 23, wherein the light conversion portion further comprises at least one of:
a phosphor layer emitting light through wavelength conversion of light emitted from the light emitting diodes; and
a color filter configured to block light emitted from the light emitting diodes having a predetermined wavelength.

* * * * *